US008314009B2

(12) United States Patent  
Yamazaki

(10) Patent No.: US 8,314,009 B2
(45) Date of Patent: Nov. 20, 2012

(54) METHOD FOR MANUFACTURING SOI SUBSTRATE AND METHOD FOR MANUFACTURING SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/208,779

(22) Filed: Sep. 11, 2008

(65) Prior Publication Data

US 2009/0075408 A1 Mar. 19, 2009

(30) Foreign Application Priority Data

Sep. 14, 2007 (JP) ................. 2007-239524

(51) Int. Cl.
H01L 21/30 (2006.01)
H01L 21/46 (2006.01)
(52) U.S. Cl. ........... 438/458; 438/22; 438/151; 257/347
(58) Field of Classification Search .................. None
See application file for complete search history.

(56) References Cited

U.S. PATENT DOCUMENTS

| 4,276,477 | A | 6/1981 | Enge |
|---|---|---|---|
| 4,578,589 | A | 3/1986 | Aitken |
| 4,612,698 | A | 9/1986 | Gonsiorawski et al. |
| 4,804,852 | A | 2/1989 | Rose et al. |
| 4,847,504 | A | 7/1989 | Aitken |
| 4,859,908 | A | 8/1989 | Yoshida et al. |
| 5,126,575 | A | 6/1992 | White |
| 5,134,301 | A | 7/1992 | Kamata et al. |
| 5,189,303 | A | 2/1993 | Tanjyo et al. |
| 5,192,523 | A | 3/1993 | Wu et al. |
| 5,216,253 | A | 6/1993 | Koike |
| 5,343,047 | A | 8/1994 | Ono et al. |
| 5,374,564 | A | 12/1994 | Bruel |
| 5,389,793 | A | 2/1995 | Aitken et al. |
| 5,397,956 | A | 3/1995 | Araki et al. |
| 5,409,848 | A | 4/1995 | Han et al. |
| 5,413,946 | A | 5/1995 | Hong |
| 5,424,244 | A | 6/1995 | Zhang et al. |
| 5,620,906 | A | 4/1997 | Yamaguchi et al. |
| 5,696,382 | A | 12/1997 | Kwon |

(Continued)

FOREIGN PATENT DOCUMENTS

EP   0135366 A   3/1985

(Continued)

*Primary Examiner* — Evan Pert
*Assistant Examiner* — Andres Munoz
(74) *Attorney, Agent, or Firm* — Eric J. Robinson; Robinson Intellectual Property Law Office, P.C.

(57) ABSTRACT

A nitrogen-containing layer is formed over a semiconductor substrate; ions are added at a predetermined depth in the semiconductor substrate through the nitrogen-containing layer to form a separation layer; an insulating layer is formed over the nitrogen-containing layer; a surface of the insulating layer and a surface of a base substrate are bonded to each other; the semiconductor substrate is cleaved with the separation layer as a cleavage plane, so that single crystal semiconductor layer is formed over the base substrate with the insulating layer interposed therebetween. The ions are added by irradiating the semiconductor layer with an ion beam in a rectangular shape or a linear shape while moving the semiconductor substrate relative to the ion beam in a short side direction of the ion beam.

30 Claims, 11 Drawing Sheets

U.S. PATENT DOCUMENTS

| | | |
|---|---|---|
| 5,721,687 A | 2/1998 | Lamartine et al. |
| 5,760,405 A | 6/1998 | King et al. |
| 5,767,522 A | 6/1998 | Kodama |
| 5,804,471 A | 9/1998 | Yamazaki et al. |
| 5,825,035 A | 10/1998 | Mizumura et al. |
| 5,837,568 A | 11/1998 | Yoneda et al. |
| 5,849,043 A | 12/1998 | Zhang et al. |
| 5,858,819 A | 1/1999 | Miyasaka |
| 5,892,235 A | 4/1999 | Yamazaki et al. |
| 6,160,262 A | 12/2000 | Aoki et al. |
| 6,165,876 A | 12/2000 | Yamazaki et al. |
| 6,313,002 B1* | 11/2001 | Fukuda ............... 438/373 |
| 6,329,229 B1 | 12/2001 | Yamazaki et al. |
| 6,335,231 B1 | 1/2002 | Yamazaki et al. |
| 6,362,076 B1 | 3/2002 | Inazuki et al. |
| 6,734,446 B1 | 5/2004 | Yamazaki et al. |
| 6,867,067 B2 | 3/2005 | Ghyselen et al. |
| 6,897,100 B2 | 5/2005 | Yamazaki et al. |
| 7,118,996 B1 | 10/2006 | Yamazaki et al. |
| 7,247,890 B2* | 7/2007 | Sekiguchi et al. ............ 257/192 |
| 7,300,853 B2* | 11/2007 | Joly et al. ............. 438/406 |
| 7,795,114 B2 | 9/2010 | Moriwaka |
| 2002/0008293 A1* | 1/2002 | Kuroi et al. ............. 257/412 |
| 2002/0070454 A1* | 6/2002 | Yasukawa ............. 257/760 |
| 2004/0147095 A1* | 7/2004 | Yamazaki ............. 438/479 |
| 2004/0211356 A1 | 10/2004 | Yamazaki et al. |
| 2005/0040346 A1* | 2/2005 | Lee et al. ............. 250/492.21 |
| 2006/0006493 A1* | 1/2006 | Kawano et al. ............. 257/510 |
| 2007/0026638 A1* | 2/2007 | Henley ............. 438/459 |
| 2007/0281440 A1* | 12/2007 | Cites et al. ............. 438/458 |
| 2008/0070389 A1 | 3/2008 | Yamazaki et al. |
| 2008/0078953 A1* | 4/2008 | Gupta et al. ............. 250/492.21 |
| 2008/0246109 A1 | 10/2008 | Ohnuma et al. |
| 2008/0248629 A1 | 10/2008 | Yamazaki |
| 2008/0261376 A1 | 10/2008 | Yamazaki et al. |
| 2008/0268583 A1 | 10/2008 | Yamazaki et al. |
| 2008/0283916 A1 | 11/2008 | Yamazaki |
| 2008/0286910 A1 | 11/2008 | Yamazaki et al. |
| 2008/0286952 A1 | 11/2008 | Miyairi et al. |
| 2008/0308897 A1 | 12/2008 | Kakehata et al. |
| 2008/0315351 A1 | 12/2008 | Kakehata |
| 2009/0057675 A1 | 3/2009 | Yamazaki |

FOREIGN PATENT DOCUMENTS

| | | |
|---|---|---|
| JP | 60-105153 A | 6/1985 |
| JP | 63-157868 A | 6/1988 |
| JP | 04-160744 A | 6/1992 |
| JP | 04-160745 A | 6/1992 |
| JP | 04-230944 A | 8/1992 |
| JP | 05-082083 A | 4/1993 |
| JP | 06-252079 A | 9/1994 |
| JP | 08-096742 A | 4/1996 |
| JP | 09-298043 A | 11/1997 |
| JP | 11-163363 | 6/1999 |
| JP | 11-307472 | 11/1999 |

* cited by examiner

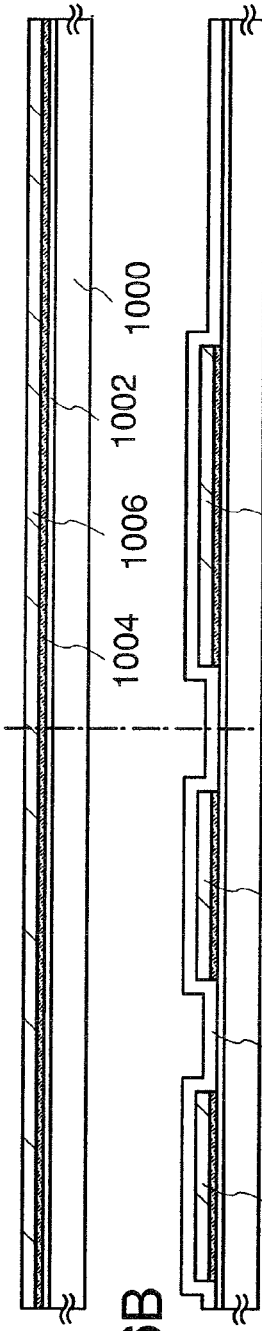
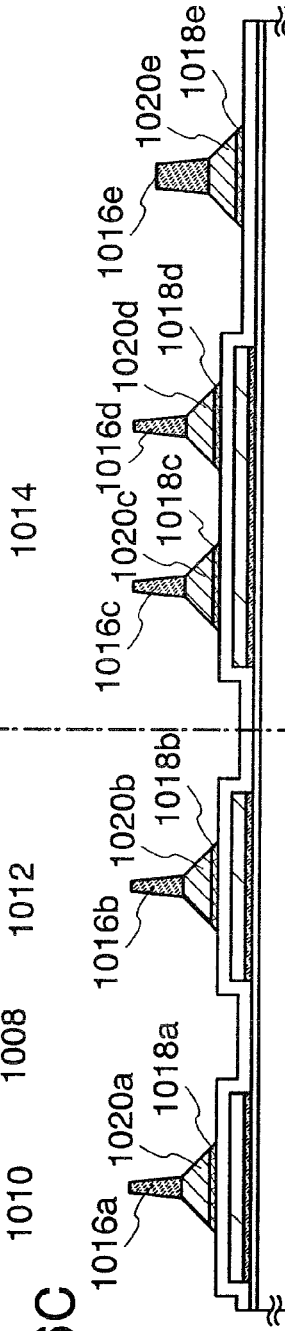
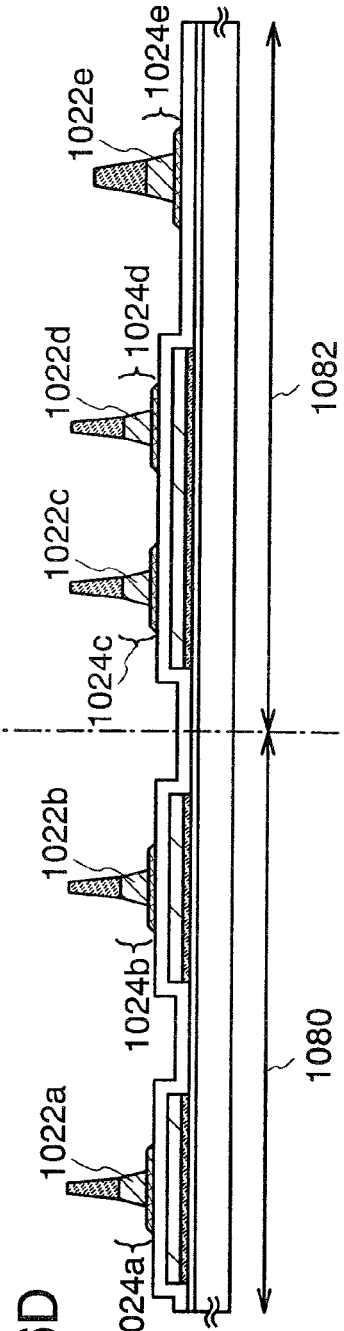

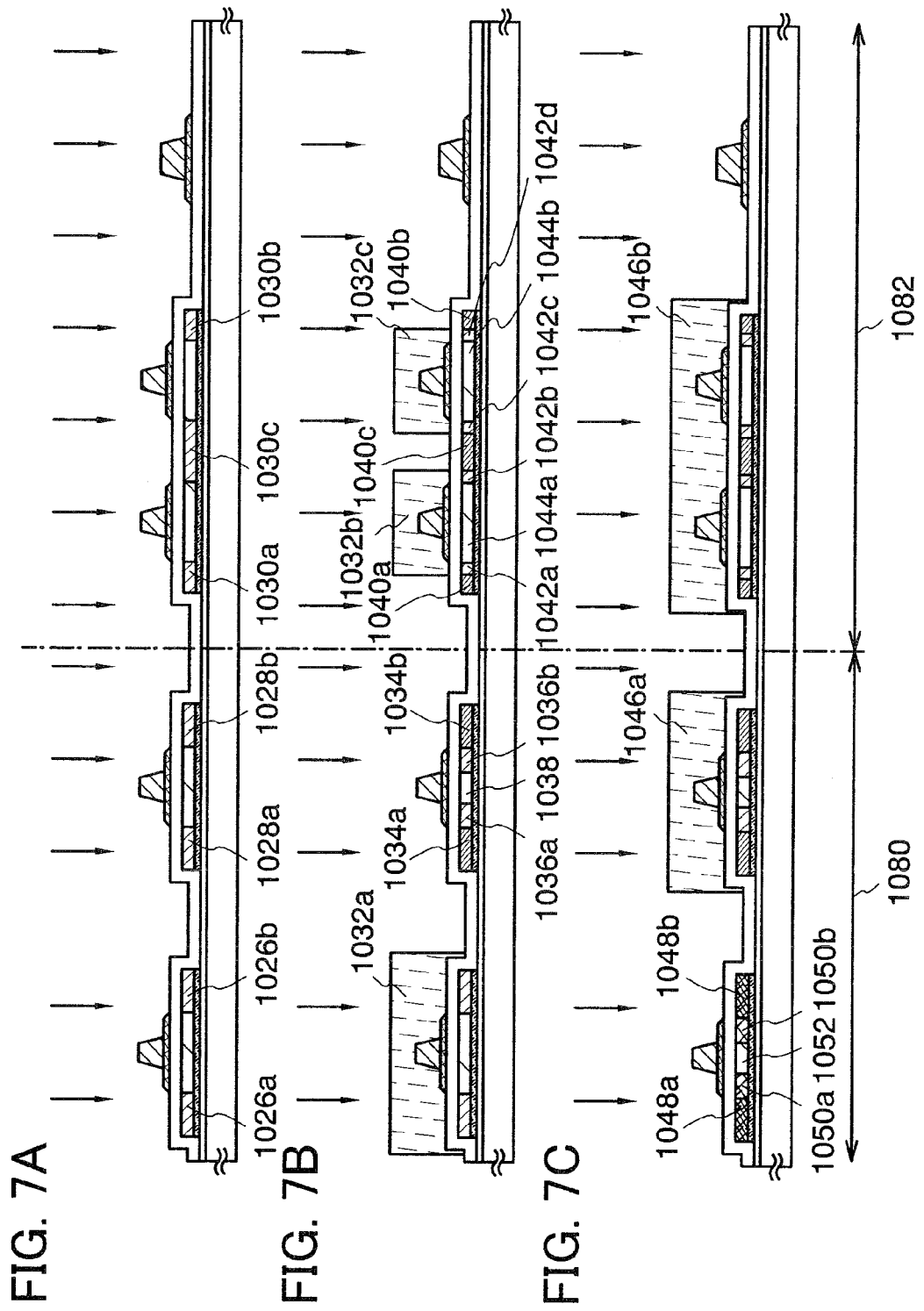

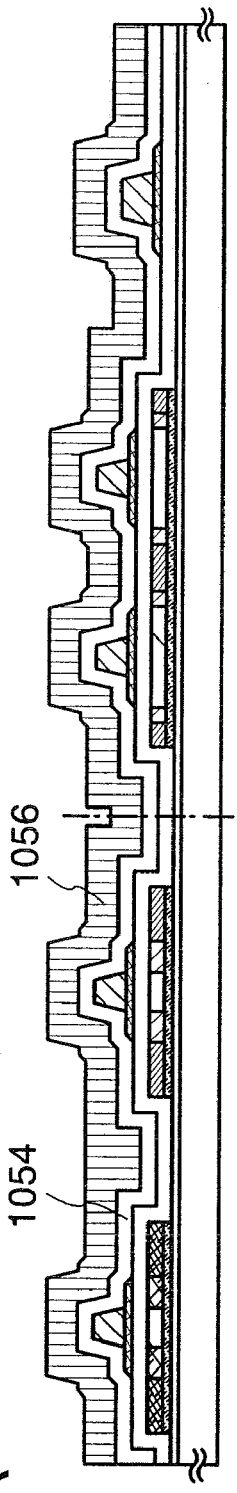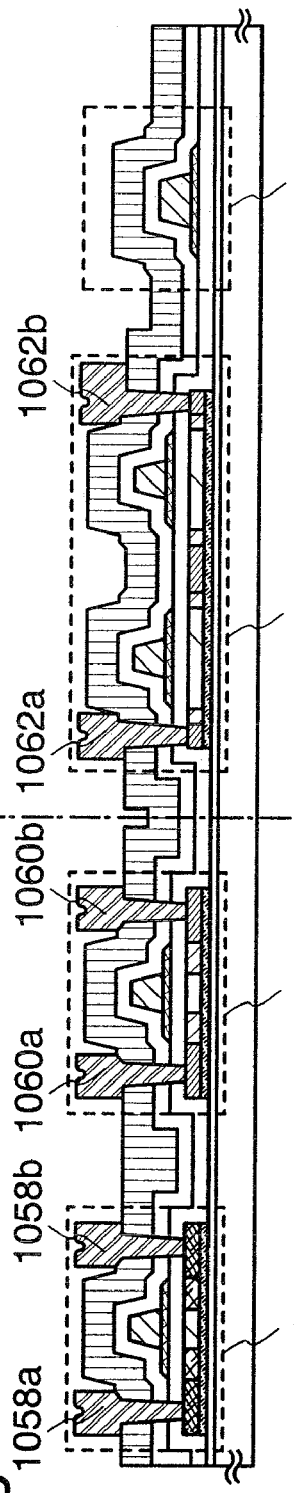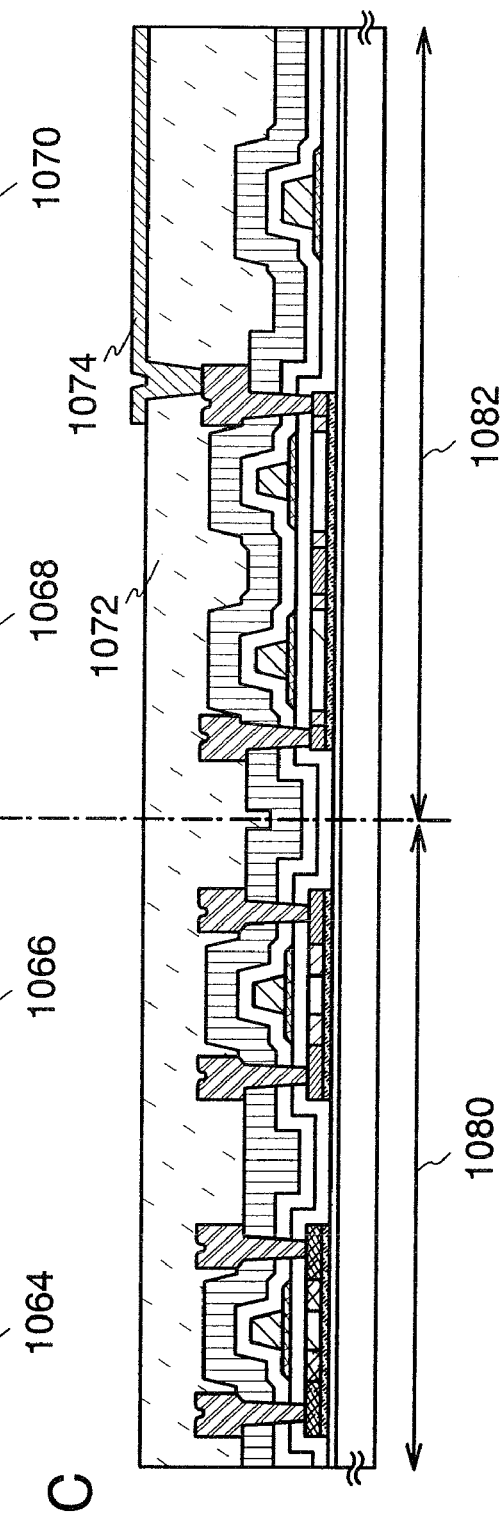

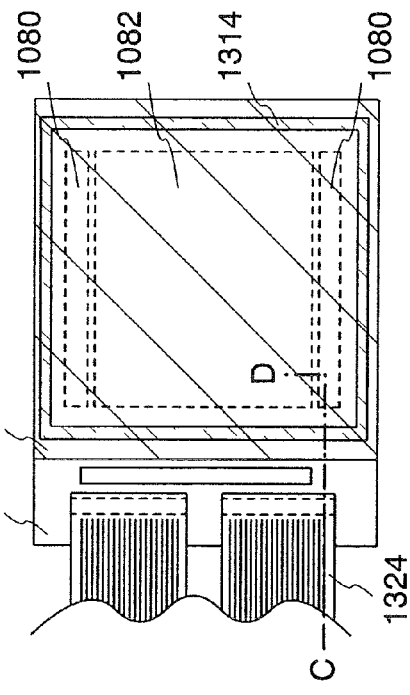
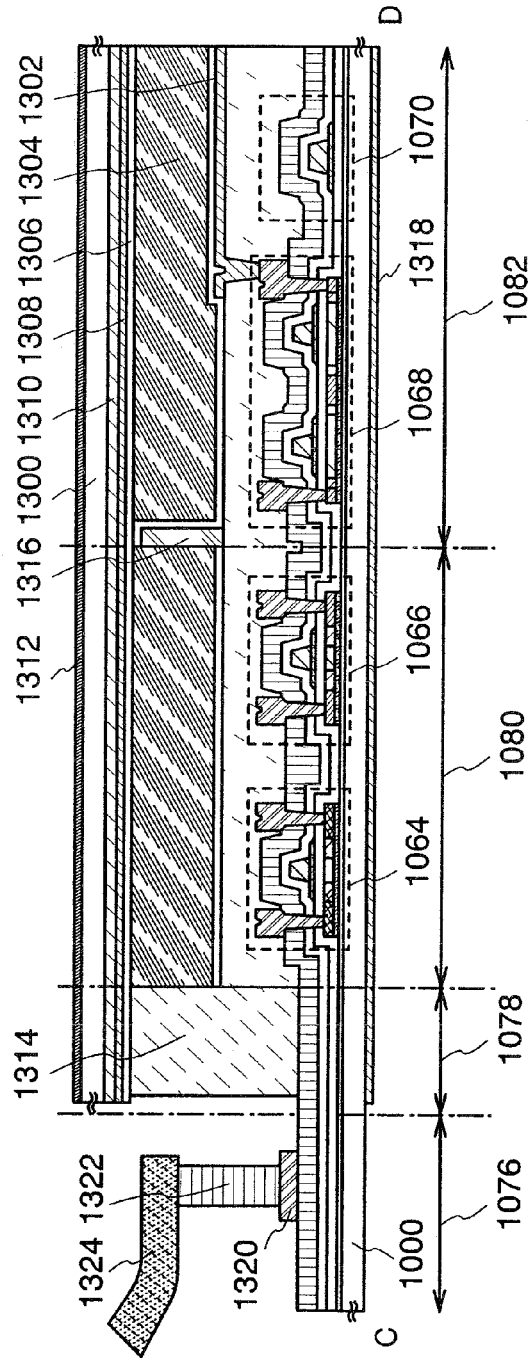
FIG. 9A
FIG. 9B

METHOD FOR MANUFACTURING SOI SUBSTRATE AND METHOD FOR MANUFACTURING SEMICONDUCTOR DEVICE

BACKGROUND OF THE INVENTION

1. Field of the Invention

The present invention relates to a silicon-on-insulator (SOI) substrate. Further, the present invention relates to a semiconductor device which is manufactured using the SOI substrate.

2. Description of the Related Art

In recent years, an integrated circuit using an SOI (silicon on insulator) substrate in which a thin single crystal semiconductor layer is formed on an insulating surface, instead of a bulk silicon wafer has been developed. Since parasitic capacitance between a drain of a transistor and a substrate is reduced with the use of an SOI substrate, an SOI substrate has been attracted attention as one improving performance of a semiconductor integrated circuit.

A Smart Cut (registered trademark) method is known as one of methods for manufacturing an SOI substrate. An outline of the method for manufacturing an SOI substrate by a Smart Cut (registered trademark) method is described below. First, hydrogen ions are implanted into a silicon wafer by an ion implantation method, so that an ion implantation layer is formed at a predetermined depth from a surface. Then, the silicon wafer into which the hydrogen ions are implanted is bonded to another silicon wafer with a silicon oxide film interposed therebetween. After that, the ion implanted layer is to be a cleavage plane by heat treatment, and the silicon wafer into which the hydrogen ions are implanted is separated in a thin film state, so that a silicon film is formed on the bonded silicon wafer. A Smart Cut (registered trademark) method may be referred to as a hydrogen ion implantation separation method.

As the hydrogen ion implantation separation method is a method in which ions are separated by mass, ions are deflected electromagnetically, and then ions are implanted to a fixed substrate by performing a raster scanning, there is a variation in a distribution of ion implantation of concentration of ions or a depth at which ions are added, so that projections and depressions are generated on a surface of a single crystal semiconductor layer which has been cleaved. When there are large projections and depressions on a surface of the single crystal semiconductor layer and a gate insulating film is formed thereover, the projections and depressions penetrate the gate insulating film, which causes a problem of leakage between the semiconductor layer and a gate electrode.

Therefore, in general, chemical mechanical polishing (CMP) is performed on the surface of the semiconductor layer having the projections and depressions after cleavage Reference 1 (Japanese Published Patent Application No. H11-307472) discloses a technique in which a surface of a single crystal semiconductor layer is planarized by heat treatment in a hydrogen atmosphere after the cleavage.

As an example of a technique of forming a thin single crystal silicon film over a glass substrate by such a Smart Cut (registered trademark) method, a technique by the present applicant has been known (for example, Reference 2: Japanese Published Patent Application No. H11-163363).

SUMMARY OF THE INVENTION

A glass substrate is a low-priced substrate and can be prepared with a larger area than an area of a silicon wafer. Thus, the glass substrate is mainly used for manufacturing a liquid crystal display device. A glass substrate is used for a base substrate, so that a low-priced and large-area SOI substrate can be manufactured. However, a heat resistance of a glass substrate is lower than that of a silicon wafer. Therefore, an SOI substrate after bonding a single crystal silicon layer which has been separated can not be heated at a temperature which exceeds a heat-resistance temperature of the glass substrate, and the process temperature in manufacturing an SOI substrate is limited.

In addition, since the substrate is large, an apparatus or a treatment method to be used is limited naturally. For example, when projections and depressions of the single crystal silicon layer bonded to the large-area glass substrate are removed by polishing treatment such as a CMP method, it is difficult to achieve reduction in cost or process with high throughput because the glass substrate and the silicon wafer have different shapes and sizes, and so on.

In view of problems described above, an object of the present invention is to provide a method for manufacturing an SOI substrate, in which separation is performed while keeping a planarity of a separation surface, even when a semiconductor substrate is cleaved to be separated. Further, another object of the present invention is to provide a method for manufacturing an SOI substrate provided with a semiconductor layer which can be used practically even when a substrate having a low heat-resistant temperature, such as a glass substrate, is used.

According to the present invention, addition of ions to a semiconductor substrate is performed by irradiating the semiconductor substrate with an ion beam in a rectangular shape or a linear shape. Here, the rectangular shape includes a shape in which a corner of the rectangular has a round shape. Hereinafter, a specific structure of the present invention is described.

One feature of a method for manufacturing an SOI substrate of the present invention is to include steps in which a semiconductor substrate and a base substrate are prepared; a nitrogen-containing layer is formed on a surface of the semiconductor substrate; a separation layer is formed in a region at a predetermined depth from the surface of the semiconductor substrate by adding accelerated ions to the semiconductor substrate through the nitrogen-containing layer; an insulating layer is formed over the nitrogen-containing layer; the surface of the semiconductor substrate and a surface of the base substrate are faced each other to bond a surface of the insulating layer and the surface of the base substrate; and a single crystal semiconductor layer is formed over the base substrate with the nitrogen-containing layer and the insulating layer interposed therebetween by cleaving the semiconductor substrate with the separation layer functioning as a cleavage plane. The ions are added by irradiating the semiconductor substrate with an ion beam in a rectangular shape or a linear shape while moving the semiconductor substrate relative to the ion beam in a short side direction of the ion beam.

Further, another feature of the method for manufacturing an SOI substrate of the present invention is to include steps in which semiconductor substrate and a base substrate are prepared; an oxide film is formed on a surface of the semiconductor substrate by performing heat treatment on the semiconductor substrate in an oxidative atmosphere containing halogen; a separation layer is formed in a region at a predetermined depth from a surface of the semiconductor substrate by adding accelerated ions to the semiconductor substrate through the oxide film; a nitrogen-containing layer is formed over the oxide film; an insulating layer is formed over the nitrogen-containing layer; the surface of the semiconductor substrate and a surface of the base substrate are faced each other to bond a surface of the insulating layer and the surface of the base substrate; and a single crystal semiconductor layer is formed over the base substrate with the insulating layer, the nitrogen-containing layer, and the oxide film interposed therebetween by cleaving the semiconductor substrate with the separation layer functioning as a cleavage plane. The ions are added by irradiating the semiconductor substrate with an ion beam in a rectangular shape or a linear shape while moving the semiconductor substrate relative to the ion beam in a short side direction of the ion beam.

In addition, another feature of the method for manufacturing an SOI substrate of the present invention is to include steps in which a semiconductor substrate and a base substrate are prepared; a first insulating layer is formed on a surface of the semiconductor substrate; a separating layer is formed in a region at a predetermined depth from the surface of the semiconductor layer by adding accelerated ions to the semiconductor substrate through the first insulating layer; a nitrogen-containing layer and a second insulating layer are stacked to be formed over the base substrate; the surface of the semiconductor substrate and a surface of the base substrate are faced each other to bond a surface of the first insulating layer and a surface of the second insulating layer; and a single crystal semiconductor layer is formed over the base substrate with the nitrogen-containing layer, the first insulating layer, and the second insulating layer interposed therebetween by cleaving the semiconductor substrate with the separation layer functioning as a cleavage plane. The ions are added by irradiating the semiconductor substrate with an ion beam in a rectangular shape or a linear shape while moving the semiconductor substrate relative to the ion beam in a short side direction of the ion beam.

In this specification, an ion doping method is a technique in which ions are accelerated by an electric field without mass separation, and the ions are introduced into a semiconductor.

Further, a semiconductor device in this specification generally indicates all devices that are capable of functioning with the use of semiconductor characteristics, and electro-optic devices, semiconductor circuits, and electronic devices are all semiconductor devices.

In addition, in this specification, a display device includes a light-emitting device and a liquid crystal display device. The light-emitting device includes a light-emitting element, and the liquid crystal display device includes a liquid crystal element. A light-emitting element includes, in its category, an element whose luminance is controlled by a current or a voltage, and specifically includes an inorganic electroluminescent (EL) element, an organic EL element, and the like.

According to the present invention, the semiconductor layer can be separated from the semiconductor substrate while keeping planarity of the separation surface. Further, an SOI substrate provided with a semiconductor layer which can be used practically can be manufactured, even when a substrate having a low heat-resistant temperature, such as a glass substrate, is used.

BRIEF DESCRIPTION OF THE DRAWINGS

FIGS. 6A to 6D are views illustrating an example of a method for manufacturing a semiconductor device using an SOI substrate of the present invention.

FIGS. 7A to 7C are views illustrating an example of a method for manufacturing a semiconductor device using an SOI substrate of the present invention.

FIGS. 8A to 8C are views illustrating an example of a method for manufacturing a semiconductor device using an SOI substrate of the present invention.

FIGS. 9A and 9B are views illustrating an example of a method for manufacturing a semiconductor device using an SOI substrate of the present invention.

DETAILED DESCRIPTION OF THE INVENTION

Embodiment modes of the present invention will be described below with reference to the drawings. However, the present invention can be implemented in various different modes, and it is to be easily understood that various changes and modifications in modes and details thereof will be apparent to those skilled in the art without departing from the meaning and the scope of the present invention. Therefore, the present invention is not construed as being limited to the description of embodiment modes. Note that through the drawings of the embodiment modes, same parts or parts having similar functions are denoted by same numerals and will not be further explained.

(Embodiment Mode 1)

In this embodiment mode, an example of a method for manufacturing an SOI substrate will be described with reference to drawings. Specifically, a method for manufacturing an SOI substrate, in which a semiconductor substrate is irradiated with an ion beam in a rectangular shape or a linear shape, bonded to a base substrate, and separated therefrom, will be described. In the description below, a case where an ion doping method is employed as a method for adding ions to the semiconductor substrate will be shown.

Figure 1A:
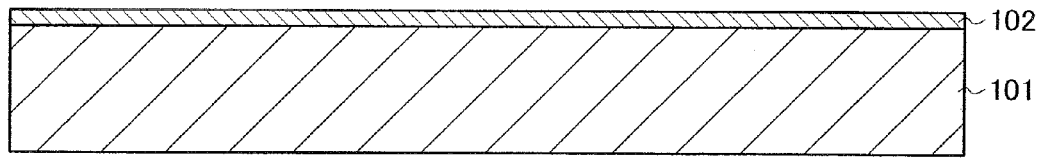
FIGS. 1A to 1D are views illustrating an example of a method for manufacturing an SOI substrate of the present invention.

First, a semiconductor substrate 101 is prepared, and a nitrogen-containing layer 102 is formed on a surface of the semiconductor substrate 101 (see FIG. 1A).

As the semiconductor substrate 101, a commercial semiconductor substrate can be used; for example, a single crystal silicon substrate, a single crystal germanium substrate, and a compound semiconductor substrate of gallium arsenide, indium phosphide, or the like can be used. A size of a commercial silicon substrate is typically five inches (125 mm) in diameter, six inches (150 mm) in diameter, eight inches (200 mm) in diameter, or 12 inches (300 mm) in diameter, and a typical shape thereof is a circular shape. Note that the shape is not limited to a circular shape and a silicon substrate which is processed to be a rectangle shape can be used.

Later, when part of the semiconductor substrate 101 is bonded to a base substrate and a semiconductor layer having a single crystal structure (hereinafter, referred to as a single crystal semiconductor layer) is formed, the nitrogen-containing layer 102 functions as a barrier layer to prevent an impurity such as a movable ion, moisture included in the base substrate, from diffusing into the single crystal semiconductor layer. Therefore, a structure in which the nitrogen-containing layer 102 is not formed may be employed depending on a material for use in the base substrate.

The nitrogen-containing layer 102 is formed to have a single layer structure or a stacked layer structure of a silicon nitride layer, a silicon nitride oxide layer, or a silicon oxynitride layer by a CVD method, a sputtering method, or the like. The nitrogen-containing layer 102 is preferably formed to be a thickness of 50 nm to 200 nm. For example, a silicon oxynitride layer and a silicon nitride oxide layer are stacked from the semiconductor substrate 101 side, so that the nitrogen-containing layer 102 can be obtained.

Note that a silicon oxynitride film refers to a film that contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film refers to a film that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

Figure 1B:
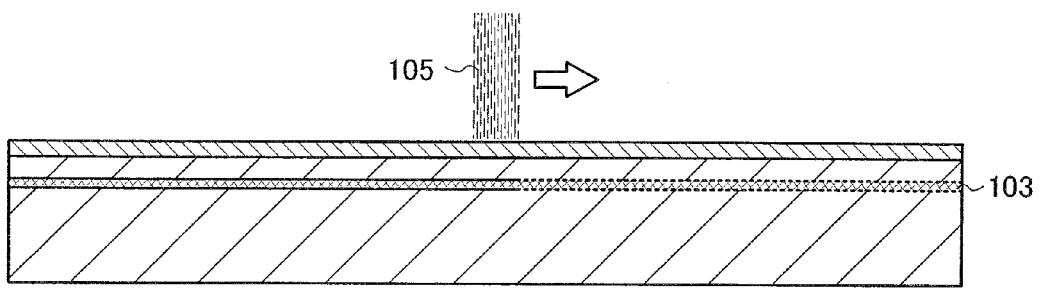

Next, ions accelerated by an electric field are added at a predetermined depth from a surface of the semiconductor substrate 101, and a separation layer 103 is formed (see FIG. 1B). The ions are added by irradiating the semiconductor substrate 101 with an ion beam 105 of which cross section is a linear shape or a rectangle shape.

Further, in this embodiment mode, as a method for adding the ions to the semiconductor substrate 101, a method in which an ion-doping apparatus is used is employed. In other words, a doping method in which a plurality of ion species generated by making a source gas into plasma are introduced without mass separation and added to the semiconductor substrate 101, is used.

Figure 3A:
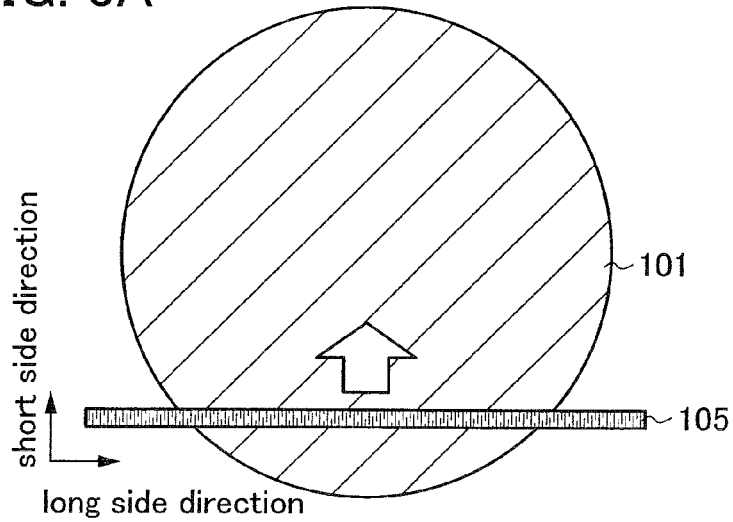
FIGS. 3A and 3B are views illustrating an example of a method for manufacturing an SOI substrate of the present invention.
Figure 3B:
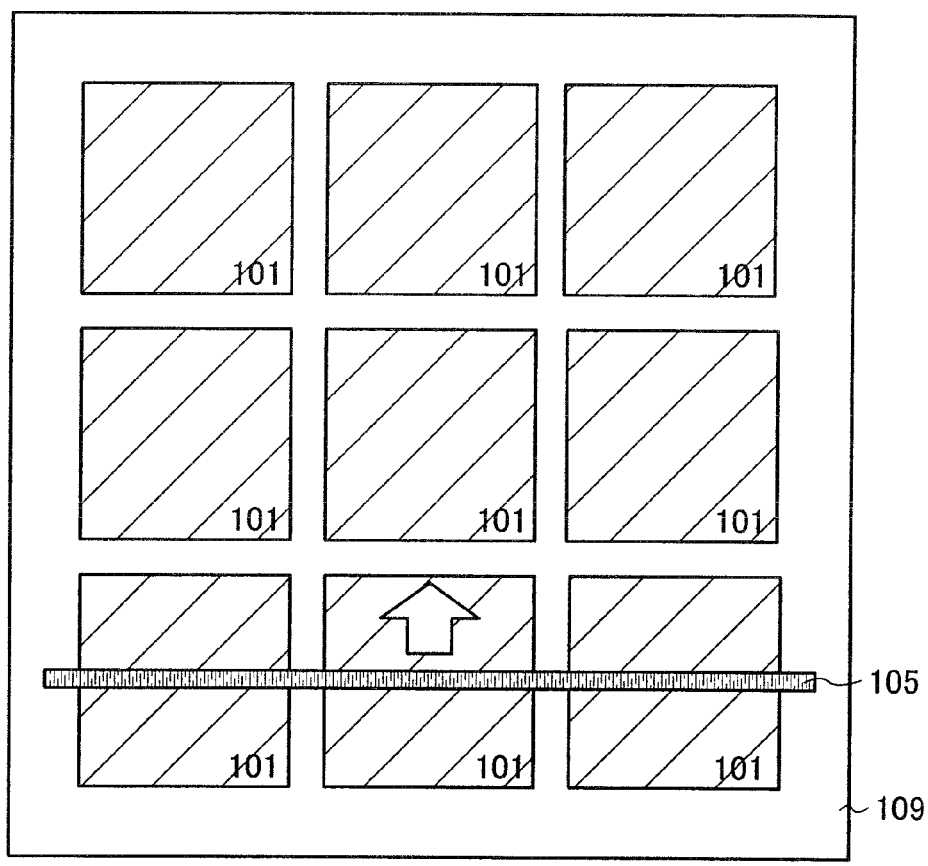

For example, in the case where a circular silicon wafer is used for the semiconductor substrate 101, the ion beam 105 in a rectangular shape or a linear shape is formed so as to be larger than the diameter of the silicon wafer, and the ions can be added at a predetermined depth of the semiconductor substrate by moving the semiconductor substrate 101 relative to the ion beam 105 in a short side direction of the ion beam 105 (see FIG. 3A). Further, the shape of the semiconductor substrate 101 is not limited into a circular shape. For example, in the case where plural silicon wafers processed into a square shape or a rectangular shape are arranged on a supporting substrate 109 to perform a bonding to the base substrate, the ions may be added by irradiating the plural silicon wafers with the linear ion beam 105 at the same time (see FIG. 3B).

By adding the ions to the semiconductor substrate 101 with irradiation with the ion beam which is a rectangular shape or a linear shape, the distribution of an addition of the ions can be more homogeneous compared with the case where the ions are added to a large area at one time. This is because in the case where the ions are added to a large area at one time, homogeneity of the distribution of the addition of the ions in two dimension (a long side direction and a short side direction) is needed, however, in the case where the ions are added by scanning with an ion beam which is a rectangular shape or a linear shape, only homogeneity in long side direction is needed.

Note that in the case where the semiconductor substrate 101 is irradiated with the ion beam 105 which is a rectangular shape or a linear shape, the semiconductor substrate 101 is moved relative to the ion beam 105 in a short side direction of the ion beam 105, so that the ions are added to the whole surface of the semiconductor substrate 101. Either a method in which the ion beam is not moved but the semiconductor substrate 101 is moved, or a method in which the semiconductor substrate 101 is not moved but the ion beam is moved to scan, may be employed.

As a source gas in the step of adding the ions, a hydrogen gas can be used. $H^+$, $H_2^+$, and $H_3^+$ are generated from a hydrogen gas ($H_2$ gas). When the hydrogen gas is used as a source gas, it is preferable that $H_3^+$ be the largest number of ions with which the semiconductor substrate 101 is irradiated. In the case of the irradiation with $H_3^+$ ions, the irradiation efficiency of ions is more improved than that in the case of the irradiation with $H^+$ or $H_2^+$, and the irradiation time can be shortened. In addition, a crack occurs easily in the separation layer 103.

It is preferably that $H_3^+$ ions of 70% or more be included with respect to the total amount of ion species of $H^+$, $H_2^+$, and $H_3^+$ in the ion beam 105. The proportion of $H_3^+$ ions is further preferably 80% or more. By increasing the proportion of $H_3^+$, it is possible to contain hydrogen of $1\times10^{20}$ atoms/cm$^3$ or more in the separation layer 103. It is preferable that the separation layer 103 contain hydrogen of $5\times10^{20}$ atoms/cm$^3$ or more. When a high concentration hydrogen addition region is locally formed in the semiconductor substrate 101, the crystal structure is damaged, and microvoids are formed, so that the separation layer 103 has a porous structure. Therefore, the volume of microvoids formed in the separation layer 103 is changed by heat treatment at a relatively low temperature (600° C. or lower), and the semiconductor substrate 101 can be cleaved along the separation layer 103.

As a source gas in the ion irradiation step, one or more kinds of gas selected from deuterium, a rare gas such as a helium gas or an argon gas, a halogen gas typified by a fluorine gas or a chlorine gas, and a halogen compound gas such as a fluorine compound gas (e.g., $BF_3$) can be used in addition to a hydrogen gas. When helium is used for a source gas, the ion beam 105 which is a rectangular shape or a linear shape with high proportion of $He^+$ ions can be formed without mass separation. The semiconductor substrate 101 is irradiated with such an ion beam 105, whereby microvoids can be formed in the separation layer 103 efficiently.

Further, by performing the ion doping steps plural times, the separation layer 103 also can be formed. In this case, the same process gas may be used in all ion doping steps or different process gas may be used in each ion doping step. For example, first, ion doping is performed using a rare gas as a source gas. Next, an ion doping step is performed using a hydrogen gas as a process gas. Alternatively, first, an ion doping step can be performed using a halogen gas or a halogen compound gas, and the next ion doing step can be performed using a hydrogen gas.

The ion doping is performed in consideration of the thickness of the single crystal semiconductor layer which is separated from the semiconductor substrate 101 and transferred to the base substrate later. It is preferable that the film thickness of the single crystal semiconductor layer be set to be 5 nm to 500 nm, more preferably, 10 nm to 200 nm. Accelerating voltage at the time of doping with ions and a dosage of ions are selected as appropriate in consideration of the thickness of the single crystal semiconductor layer which is to be transferred.

Figure 1C:
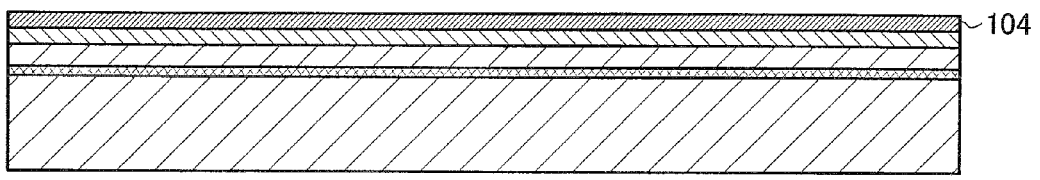

An insulating layer 104 is formed over the semiconductor substrate 101 with the nitrogen-containing layer 102 interposed therebetween (see FIG. 1C).

The insulating layer 104, which functions as a bonding layer with the base substrate, is formed on a surface which is to form a bonding with the base substrate. The insulating layer 104 may have a single layer structure or a stacked layer structure, and an insulating layer having a surface to form a bonding with the base substrate (hereinafter, also referred to as a "bonding surface") which has a smooth and hydrophilic surface, is preferably used. A silicon oxide layer is suitable for the insulating layer which has a smooth surface and can form a hydrophilic surface. In particular, a silicon oxide layer which is deposited by a chemical vapor deposition method using an organosilane is preferable. This is because the bonding between the base substrate and the single crystal semiconductor layer can be strengthened by using the silicon oxide layer deposited using an organosilane. Note that in the case where the nitrogen-containing layer 102 is not formed, the insulating layer 104 may be formed over the semiconductor substrate 101 before the ions are added to the semiconductor substrate 101.

As the organosilane, a compound containing silicon such as tetraethoxysilane (abbr.: TEOS; chemical formula: $Si(OC_2H_5)_4$), tetramethylsilane (abbr.: TMS; chemical formula: $Si(CH_3)_4$), trimethylsilane (chemical formula: $(CH_3)_3SiH$), tetramethylcyclotetrasiloxane (abbr.: TMCTS), octamethylcyclotetrasiloxane (abbr.: OMCTS), hexamethyldisilazane (abbr.: HMDS), triethoxysilane (chemical formula: $SiH(OC_2H_5)_3$), or trisdimethylaminosilane (chemical formula: $SiH(N(CH_3)_2)_3$) can be used.

In this embodiment mode, a silicon oxide layer which is deposited by a chemical vapor deposition method using an organosilane as a source gas is formed over the nitrogen-containing layer 102. Alternatively, a silicon oxide layer or a silicon oxynitride layer which are deposited by a chemical vapor deposition method using a silane as a source gas can be used. Deposition by a chemical vapor deposition method is performed at a temperature low enough to keep from degassing of the separation layer 103 formed in the semiconductor substrate 101. For example, it is preferable that the deposition temperature be lower than or equal to 350° C. Note that a temperature of heat treatment which is higher than the deposition temperature by a chemical vapor deposition method is applied to heat treatment for separating the single crystal silicon from the semiconductor substrate 101.

Figure 1D:
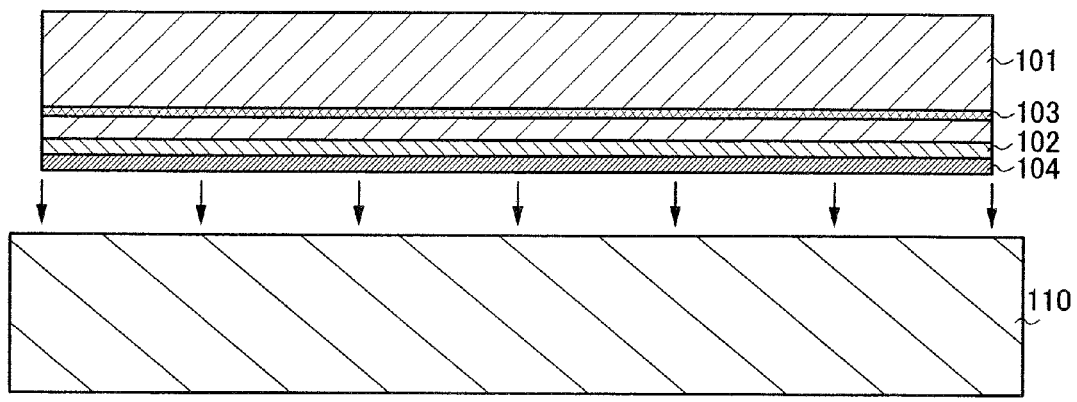

Next, the semiconductor substrate 101 and the base substrate 110 are bonded to each other (see FIG. 1D). A surface of the insulating layer 104 formed over the semiconductor substrate 101 is disposed in contact with a surface of the base substrate 110 to form a bonding. This bonding is formed under the action of a van der Waals force, and a strong bonding can be formed by hydrogen bonding by pressing of the base substrate 110 and the semiconductor substrate 101 against each other.

A substrate having an insulating surface is used for the base substrate 110. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be used. It is preferable that a glass substrate be used for the base substrate 110: for example, a large-sized mother glass called "the sixth generation" (1500 mm×1850 mm), "the seventh generation" (1870 mm×2200 mm), or the "eighth generation (2200 mm×2400 mm) is used. By manufacturing an SOI substrate with the use of a large-sized mother glass as the base substrate 110, the SOI substrate can have a large area. Thus, the number of display panels which can be manufactured from a single substrate (panels yielded per substrate) can be increased, and accordingly, productivity can be improved.

In order to favorably perform a bonding between the base substrate 110 and the insulating layer 104, a bonding surface may be activated. For example, one or both of the surfaces on which the bonding is formed are irradiated with an atomic beam or an ion beam. When an atomic beam or an ion beam is used, an inert gas neutral atom beam or inert gas ion beam of argon or the like can be used. It is also possible to activate the bonding surface by plasma irradiation or radical treatment. Such surface treatment facilitates forming bonding between different materials even at a temperature of 400° C. or lower.

Figure 2A:
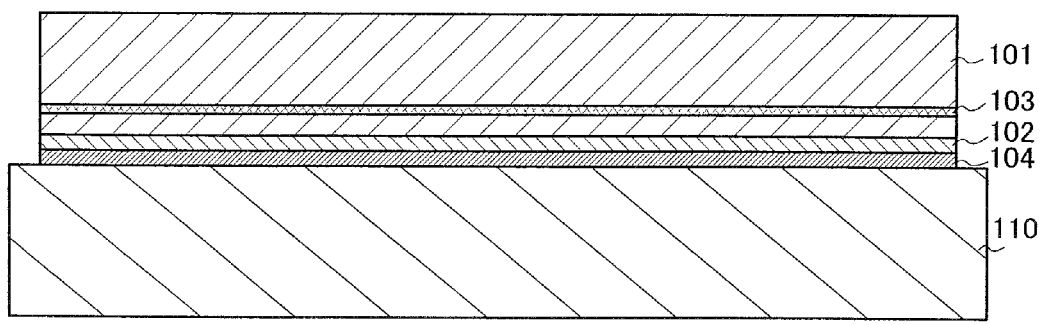
FIGS. 2A and 2B are views illustrating an example of a method for manufacturing an SOI substrate of the present invention.

Further, after the base substrate 110 and the semiconductor substrate 101 are bonded to each other with the insulating layer 104 interposed therebetween (see FIG. 2A), it is preferable that heat treatment and/or pressure treatment be performed. Heat treatment or pressure treatment makes it possible to increase bonding strength between the base substrate 110 and the semiconductor substrate 101. A temperature of heat treatment is lower than the heat-resistant temperature of the base substrate 110. Pressure treatment is performed, so that pressure is applied to a bonding surface in a perpendicular direction, in consideration of the pressure resistance of the base substrate 110 and the semiconductor substrate 101.

Figure 2B:
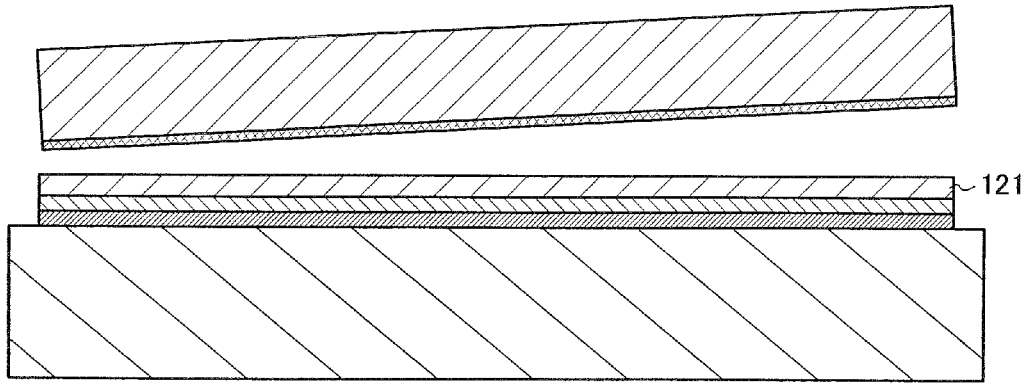

Next, heat treatment is performed, so that part of the semiconductor substrate 101 is separated from the base substrate 110 with separation layer 103 functioning as a cleavage plane (see FIG. 2B). It is preferable that a temperature of heat treatment be higher than or equal to the deposition temperature of the insulating layer 104 and lower than or equal to the heat-resistant temperature of the base substrate 110. For example, by performing the heat treatment at 400° C. to 600° C., the volume change of microvoids formed in the separation layer 103 occurs, which allows cleavage to occur along the separation layer 103. Since the insulating layer 104 is bonded to the base substrate 110, a single crystal semiconductor layer 121 having the same crystallinity as that of the semiconductor substrate 101 is left over the base substrate 110.

Through the above-described steps, an SOI substrate in which the single crystal semiconductor layer 121 is provided over the base substrate 110 with the insulating layer 104 interposed therebetween is obtained.

In general, when an ion implantation separation method is employed, since distribution of ion implantation varies and unevenness is generated on a surface of the single crystal semiconductor layer 121 obtained by separation, it is necessary to perform chemical mechanical polishing (CMP) or heat treatment at the temperature which is higher than or equal to the heat-resistant temperature of a glass substrate for planarizing the surface. On the other hand, as shown in this embodiment mode, since a surface of the single crystal semiconductor layer 121, which is obtained by cleaving the semiconductor substrate with the separation layer formed by irradiating with the ion beam in a rectangular shape or a linear shape, is plane, a step of chemical mechanical polishing or heat treatment at high temperature can be omitted.

Therefore, even when a substrate with low heat resistance such as a glass substrate is used as a base substrate, an SOI substrate having a single crystal semiconductor layer which can be used in practical applications can be obtained. Further, in the case where the single crystal semiconductor layer is bonded to a large-sized glass substrate, a cost can be reduced and a throughput can be improved because the CMP step can be omitted. In addition, since the separated surface of the semiconductor substrate 101 which is separated is also plane, the semiconductor substrate 101 can be reused without chemical mechanical polishing and heat treatment at high temperature.

Note that in this embodiment mode, plane surface can be obtained without a physical polishing means such as CMP. In addition, the surface of the single crystal semiconductor layer 121 may be irradiated with a laser beam to be planarized if necessary. It is preferable that irradiation with the laser beam be performed in an inert atmosphere (for example, in a nitrogen atmosphere, in a rare gas atmosphere, or the like) in which the oxygen concentration is 10 ppm or less. This is because laser beam irradiation in an oxygen atmosphere may make the surface of the single-crystal semiconductor layer 121 rough.

Further, plural semiconductor substrates 101 can be arranged over a large base substrate 110 to form the single crystal semiconductor layers 121 over the base substrate 110. In this case, a large semiconductor device can be manufactured without depending on the size of the semiconductor substrate 101.

Note that the method for manufacturing the SOI substrate described in this embodiment mode can be combined with manufacturing methods shown in other embodiment modes in this specification as appropriate.

(Embodiment Mode 2)

In this embodiment mode, a method for manufacturing an SOI substrate which is different from that in the above-described embodiment mode will be described with reference to drawings. Specifically, the case where the {110} plane of a silicon wafer is used as a main surface of a semiconductor substrate for manufacturing an SOI substrate will be described.

Figure 4A:
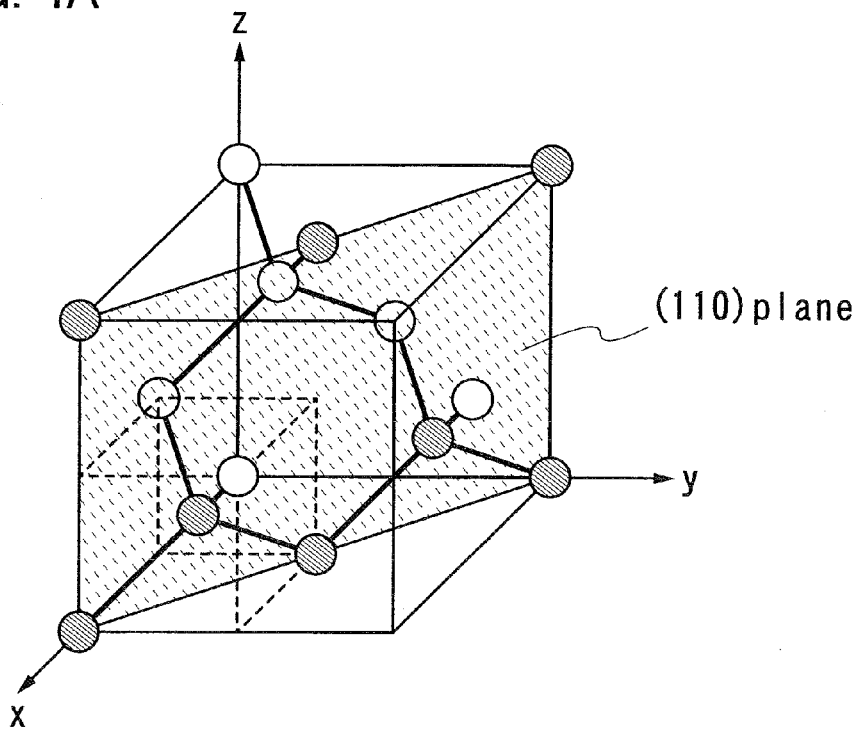
FIGS. 4A and 4B are views each illustrating a crystal lattice of a semiconductor
Figure 4B:
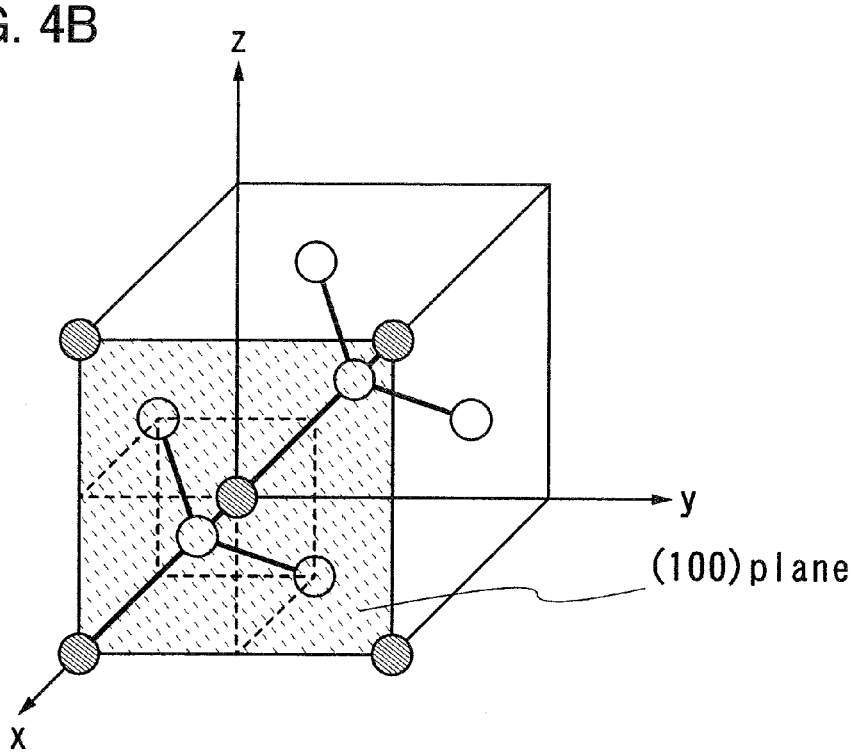

First, a crystal plane of a single crystal semiconductor is described briefly. FIGS. 4A and 4B show a relation of a unit cell of a single crystal silicon, a silicon atoms, and crystal planes. Here, FIG. 4A shows a state of the (110) plane as a representative example of the {110} plane, and FIG. 4B shows a state of the (100) plane as a representative example of the {100} plane. For simple description, part of silicon atoms which are not relative to each crystal plane is omitted. Note that in FIGS. 4A and 4B, the crystal plane is described with the use of silicon as an example, this should not to be construed as being limited.

FIG. 4A and FIG. 4B show that in the unit cell of the single crystal silicon, a planar surface density of silicon atoms of the (110) plane is higher than a surface density of silicon atoms of the (100) plane. Therefore, in the case where an SOI substrate is formed using a single crystal silicon substrate having the (110) plane as a main surface, a bonding of a silicon atom and an atom constituting an insulating layer is formed densely, and adhesion between the insulating layer and a single crystal silicon layer is improved. That is, a separation of the single crystal silicon layer can be prevented.

Further, since atoms are arranged densely on the (110) plane as described above, planarity of the single crystal silicon layer of the manufactured SOI substrate is improved compared with the case where other planes are used. In other words, a transistor which is manufactured with the use of the single crystal silicon layer has excellent characteristics. Note that the (110) plane has advantages that Young's modulus is higher compared with that of the (100) plane and cleavage occurs easily.

Next, a method for manufacturing an SOI substrate using the {110} plane of a semiconductor substrate will be described with reference to drawings. Note that the case where an insulating layer functioning as a bonding layer is provided over a base substrate will be described.

Figure 5A:
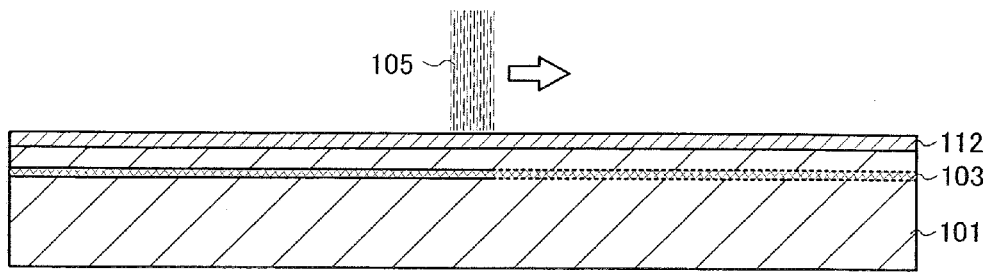
FIGS. 5A to 5C are views illustrating an example of a method for manufacturing an SOI substrate of the present invention.

First, a semiconductor substrate 101 having the {110} plane as a main surface is prepared. Then, after an insulating layer 112 which functions as a protective layer is formed over the semiconductor substrate 101, ions are added at a predetermined depth from a surface of the semiconductor substrate 101 by irradiating the semiconductor substrate 101 with an ion beam 105 in a rectangular shape or a linear shape, and a separation layer 103 is formed (see FIG. 5A). Embodiment Mode 1 can be referred to for the detail of the semiconductor substrate 101; therefore, description is omitted.

The insulating layer 112 can be formed of one or more materials selected from silicon oxide, silicon nitride, silicon nitride oxide, silicon oxynitride, and the like. Note that the insulating layer 112 may have a single layer structure or a stacked layer structure. As a method for forming the insulating layer 112, a chemical vapor deposition (CVD) method, a sputtering method, a thermal oxidation method, a thermal nitridation method, or the like can be given; however it is not limited thereto. It is preferable that the thickness of the insulating layer 112 be approximately 10 nm to 200 nm. The insulating layer 112 is provided, so that roughness of the surface of the semiconductor substrate 101 (a surface of a single crystal semiconductor layer to be formed later) caused by ion irradiation can be prevented.

Embodiment Mode 1 can be referred to for the detail of the method for forming the separation layer 103; therefore, description is omitted here. Though the insulating layer 112 may be removed after the separation layer 103 is formed, the insulating layer 112 can be made to function as a base insulating layer in the case where the insulating layer is left over.

Figure 5B:
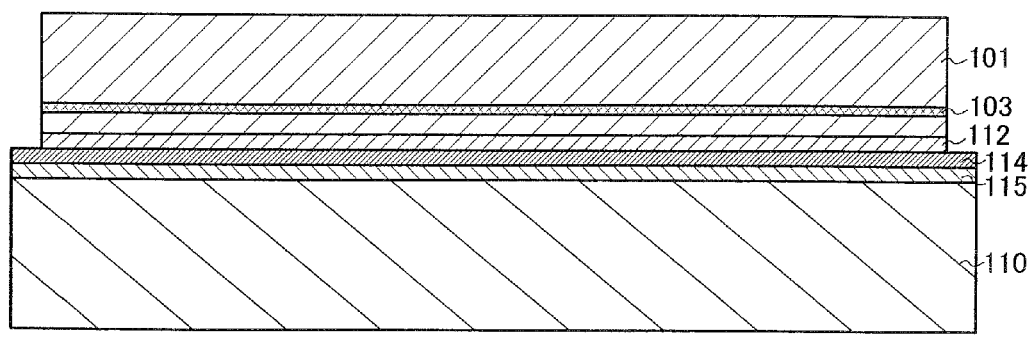

Next, a base substrate 110 over which a nitrogen-containing layer 115 and an insulating layer 114 which functions as a bonding layer, and the semiconductor substrate 101 having a surface on which insulating layer 112 is formed are bonded to each other (see FIG. 5B).

The nitrogen-containing layer 115 functions as a barrier layer for preventing impurities such as movable ions or moisture included in the base substrate from diffusing. The nitrogen-containing layer 115 is formed to have a single layer structure or a stacked layer structure of a silicon nitride layer, a silicon nitride oxide layer, or a silicon oxynitride layer by a CVD method, a sputtering method, or the like. The nitrogen-containing layer 115 is preferably formed to be a thickness of 50 nm to 200 nm. For example, a silicon oxynitride layer and a silicon nitride oxide layer are stacked from the base substrate 110 side, so that the nitrogen-containing layer 115 can be obtained.

As the insulating layer 114, a silicon oxide layer deposited by a chemical vapor deposition method using an organosilane as a source gas can be used. Alternatively, a silicon oxide layer or a silicon oxynitride layer which are deposited by a chemical vapor deposition method using a silane as a source gas can be used.

Further, after the base substrate 110 and the semiconductor substrate 101 are bonded to each other by bonding the insulating layer 114 and the insulating layer 112, it is preferable that heat treatment and/or pressure treatment be performed. Heat treatment or pressure treatment makes it possible to increase bonding strength between the base substrate 110 and the semiconductor substrate 101. A temperature of heat treatment is lower than or equal to the heat-resistant temperature of the base substrate 110. Pressure treatment is performed, so that pressure is applied to the bonding surface in a perpendicular direction, in consideration of the pressure resistance of the base substrate 110 and the semiconductor substrate 101.

Figure 5C:
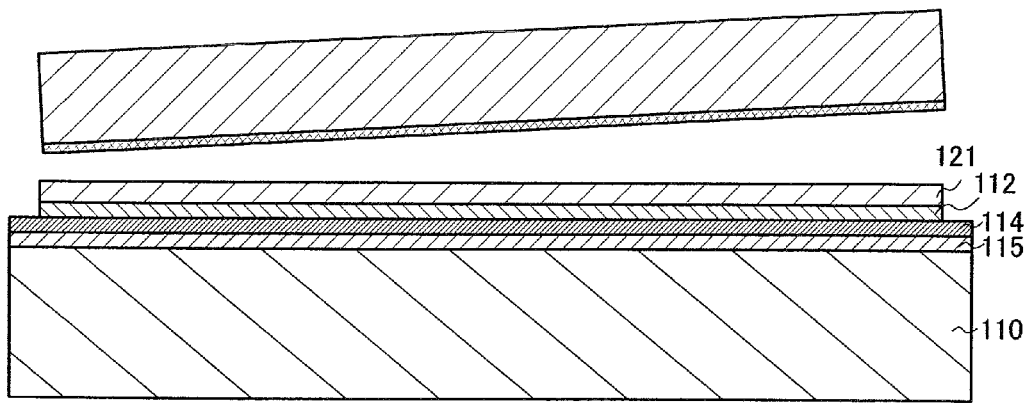

Next, heat treatment is performed, so that part of the semiconductor substrate 101 is separated from the base substrate 110 with the separation layer 103 functioning as a cleavage plane (see FIG. 5C). It is preferable that a temperature of the heat treatment be higher than or equal to the deposition temperature of the insulating layer 114 and lower than or equal to the heat-resistant temperature of the base substrate 110. For example, by performing the heat treatment at 400° C. to 600° C., a volume change of microvoids formed in the separation layer 103 occurs, which allows cleavage to occur along the separation layer 103. Since the insulating layer 114 is bonded to the base substrate 110, a single crystal semiconductor layer 121 having the same crystallinity as that of the semiconductor substrate 101 is left over the base substrate 110.

Accordingly, the SOI substrate which includes the single crystal semiconductor layer 121 having the {110} plane as a main surface can be obtained. Since the surface density of atoms of the {110} plane is higher than that of other crystal planes, adhesion between the insulating layer and the single crystal semiconductor layer is improved. In other words, a separation of the single crystal semiconductor layer is suppressed.

Further, since atoms are arranged densely on the {110} plane as described above, planarity of the single crystal silicon layer of the manufactured SOI substrate is improved compared with in the case where other planes are used. In addition, the semiconductor substrate is cleaved with the separation layer formed by the ion beam in a rectangular shape or a linear shape, so that a surface of the single crystal semiconductor layer 121 which is separated can be further planarized. As a result, in the case where chemical mechanical polishing or heat treatment at high temperature is not performed, a transistor which is manufactured with the use of the single crystal semiconductor layer 121 shown in this embodiment mode has excellent characteristics.

Note that the method for manufacturing the SOI substrate shown in this embodiment mode can be combined with methods for manufacturing shown in other embodiment modes in this specification, as appropriate.

(Embodiment Mode 3)

In this embodiment mode, a method for manufacturing an SOI substrate which is different from that in the above-described embodiment mode will be described with reference to drawings.

Figure 10A:
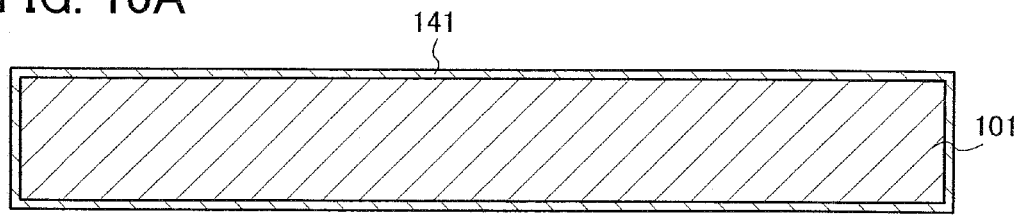
FIGS. 10A to 10D are views illustrating an example of a method for manufacturing an SOI substrate of the present invention.

First, a semiconductor substrate 101 is washed with a sulfuric acid/hydrogen peroxide mixture (SPM), an ammonia peroxide mixture (APM), a hydrochloric acid/hydrogen peroxide mixture (HPM), diluted hydrogen fluoride (DHF), or the like, as appropriate, and an oxide film 141 is formed by performing thermal oxidation to the semiconductor substrate 101 (see FIG. 10A).

Although thermal oxidation may be performed by dry oxidation, the thermal oxidation is preferably performed by oxidation in an oxidative atmosphere to which halogen is added. As a material including halogen, HCl is typical, and alternatively, one or more of HF, $NF_3$, HBr, $Cl_2$, $ClF_3$, $BCl_3$, $F_2$, $Br_2$, or the like can be used. As an example of such thermal oxidation, thermal oxidation is preferably conducted at 900° C. to 1150° C. (typically, 1000° C.) in an atmosphere including HCl at a rate of 0.5 to 10 volume % (preferably 3 volume %) with respect to oxygen. Processing time may be 0.1 to 6 hours, preferably 0.5 to 1 hour. The thickness of the oxide film to be formed is 10 nm to 1000 nm (preferably, 50 nm to 200 nm), and for example, the thickness is 100 nm.

Heat treatment at temperatures in such a range is performed, so that a gettering effect due to the halogen element for the semiconductor substrate 101 can be obtained. As the gettering effect, an effect of removing a metal impurity is particularly obtained. That is, an impurity such as metal changes into a volatile chloride and diffuses into the air to be removed by an action of chlorine. This is effective for the surface of the semiconductor substrate 101, which has been subjected to chemical mechanical polishing (CMP). In addition, hydrogen has an action of compensating defects in an interface between the semiconductor substrate 101 and the oxide film 141 so as to lower a local level density of the interface.

When halogen is included in the oxide film 141, an effect that a heavy metal which is an extrinsic impurity is captured so as to prevent contamination of the single crystal semiconductor layer can be obtained. As alternative heavy metals, Fe, Cr, Ni are included, and furthermore, Mo may be included. These are added to a single crystal semiconductor layer in the step of performing ion doping without mass separation to form a separation layer. That is, when halogen is included in the oxide film 141 by HCl oxidation or the like, the oxide film 141 has an effect of gettering an impurity such as a heavy metal which is adversary effect on the single crystal semiconductor layer. Heat treatment is performed after the oxide film 141 is formed, whereby the metal included in the single crystal semiconductor layer as an impurity precipitates to the oxide film 141 and reacted with halogen (e.g., chlorine) to be captured. Thus, the impurity captured in the oxide film 141 can be fixed, whereby contamination of the semiconductor substrate 101 can be prevented. That is, the oxide film 141 captures a metal element functioning as a life time killer of a semiconductor to prevent the metal element from diffusing again, whereby performance of a transistor can be improved.

The oxide film 141 formed by thermal oxidation contains halogen. Halogen is included at a concentration of $1 \times 10^{17}$ atoms/cm$^3$ to $5 \times 10^{20}$ atoms/cm$^3$, so that the oxide film 141 can have a function as a protective film which captures an impurity such as metal so as to prevent contamination of the semiconductor substrate 101.

Figure 10B:
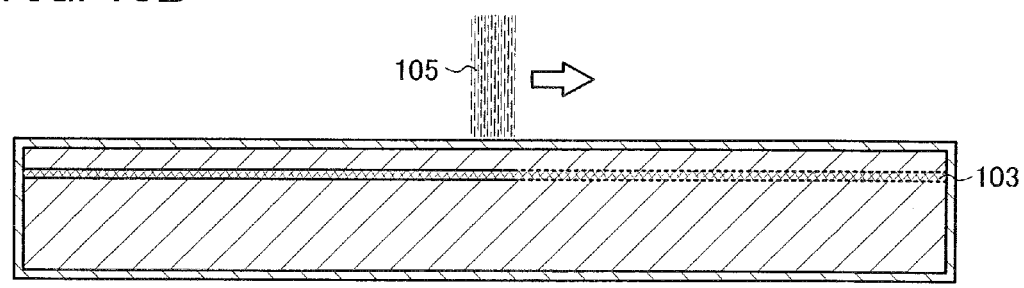

Next, the semiconductor substrate 101 is irradiated with an ion beam 105 in a rectangular shape or a linear shape through the oxide film 141, whereby ions are added at a predetermined depth from a surface of the semiconductor substrate 101 and a separation layer 103 is formed (see FIG. 10B). Embodiment Mode 1 can be referred to for the detail of the method for manufacturing the separation layer 103; therefore, description is omitted here.

An ion doping apparatus performs irradiation with ions without mass separation, so that metal ions concurrently with halogen ions or hydrogen ions are added to the semiconductor substrate 101. Since a metal ion has the large mass number, most metal ions are distributed on a top surface of a side to be irradiated with the ions. In this embodiment mode, the oxide film 141 is formed on a surface of the semiconductor substrate 101. When the oxide film 141 is formed thicker than the depth at which the metal ions are added, the distribution of the metal can be kept within the oxide film 141. When halogen is included in the oxide film 141 by HCl oxidation or the like, the oxide film 141 has an effect of gettering an impurity such as a heavy metal which is adversary effect on the semiconductor substrate 101. Thus, the impurity captured in the oxide film 141 can be fixed, whereby contamination of the semiconductor substrate 101 can be prevented.

Figure 10C:
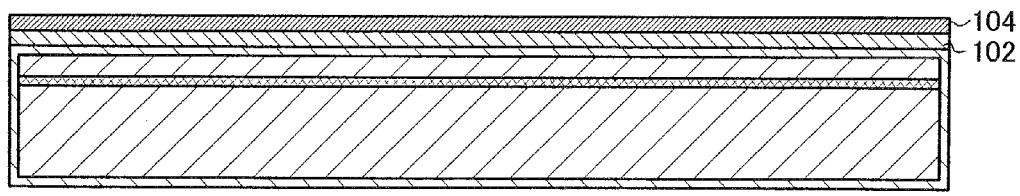

Next, a nitrogen-containing layer 102 is formed over the oxide film 141, and an insulating layer 104 functioning as a bonding layer is formed over the nitrogen-containing layer 102 (see FIG. 10C). The nitrogen-containing layer 102 and the insulating layer 104 may be formed using the manufacturing method and the material shown in Embodiment Mode 1.

Figure 10D:
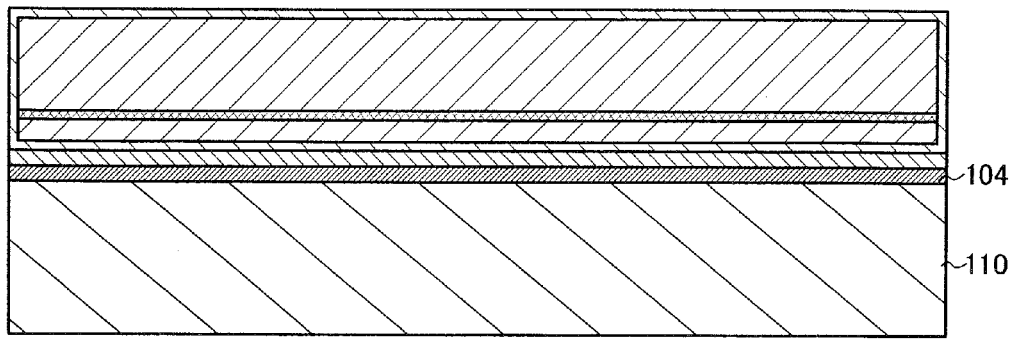

Next, the semiconductor substrate 101 and a base substrate 110 are bonded to each other (see FIG 10D). A surface of the insulating layer 104 formed over the semiconductor substrate 101 is disposed in contact with a surface of the base substrate 110 to form a bonding. This bonding is formed under the action of a van der Waals force, and the base substrate 110 and the semiconductor substrate 101 are pressed against each other, whereby a strong bonding can be formed by hydrogen bonding.

After that, heat treatment is performed, and part of the semiconductor substrate 101 is separated from the base substrate 110 with the separation layer 103 functioning as a cleavage plane, so that an SOI substrate can be manufactured.

Note that the method for manufacturing the SOI substrate shown in this embodiment mode can be combined with the manufacturing methods shown in other embodiment modes in this specification, as appropriate.

(Embodiment Mode 4)

In this embodiment mode, an example of a method for manufacturing a semiconductor device using the methods for manufacturing an SOI substrate shown in above-described embodiment modes will be described with reference to FIGS. 6A to 6D, FIGS. 7A to 7C, FIGS. 8A to 8C, and FIGS. 9A and 9B. Note that a liquid crystal display device is given as an example of a semiconductor device in this embodiment mode; however, a semiconductor device in this embodiment mode is not limited to a liquid crystal display device.

First, a single crystal semiconductor layer is formed over a base substrate using the method shown in Embodiment Mode 1, or the like (see FIG. 6A). In this embodiment mode, description is made using a structure in which a nitrogen-containing layer 1002 functioning as a barrier layer, an insulating layer 1004 functioning as a bonding layer, and a single crystal semiconductor layer 1006 are provided in this order over a base substrate 1000; however, it is not limited thereto.

Next, the single crystal semiconductor layer 1006 and the insulating layer 1004 are patterned into a desired shape to form island-shaped single crystal semiconductor layers.

Note that as an etching process in patterning, either plasma etching (dry etching) or wet etching can be used. For processing a large-sized substrate, plasma etching is suitable. As an etching gas, a fluorine-based gas or a chlorine-based gas such as $CF_4$, $NF_3$, $Cl_2$, or $BCl_3$ is used, and an inert gas such as He or Ar may be appropriately added thereto. Alternatively, local electric discharge can be performed when the etching process is performed using atmospheric pressure discharge, and etching can be performed without a formation of a mask layer over the whole surface of the substrate.

After the single crystal semiconductor layer 1006 and the insulating layer 1004 are patterned, a p-type impurity such as boron, aluminum, or gallium is preferably added thereto in order to control the threshold voltage. For example, as a p-type impurity, boron can be added at a concentration of greater than or equal to $5 \times 10^{16}$ atoms/cm$^3$ and less than or equal to $1 \times 10^{18}$ atoms/cm$^3$.

Over the base substrate 1000, a stacked layer structure of a silicon nitride film and a silicon oxide film is formed as a nitrogen-containing layer 1002. The nitrogen-containing layer 1002 is provided, so that contamination of the single crystal semiconductor layer 1006 due to movable ions can be prevented. Note that instead of silicon nitride, silicon nitride oxide, aluminum nitride, or aluminum nitride oxide may be used.

Then, a gate insulating layer 1008 covering the island-shaped single crystal semiconductor layers is formed (see FIG. 6B). Note that, the island-shaped single crystal semiconductor layers which are formed by patterning are each referred to as single crystal semiconductor layers 1010, 1012, and 1014 for convenience. The gate insulating layer 1008 is formed of an insulating film containing silicon with a thickness of approximately greater than or equal to 10 nm and less than or equal to 150 nm by a plasma CVD method, a sputtering method, or the like. Specifically, the gate insulating layer 1008 may be formed by using a material such as an oxide material or nitride material of silicon, typified by silicon nitride, silicon oxide, silicon oxynitride, and silicon nitride oxide. Note that the gate insulating layer 1008 may have either a single layer structure or a stacked layer structure.

Further, a thin silicon oxide film with a thickness of grater than or equal to 1 nm and less than or equal to 100 nm, preferably greater than or equal to 1 nm and less than or equal to 10 nm, or more preferably greater than or equal to 2 nm and less than or equal to 5 nm may be formed between the single crystal semiconductor layer and the gate insulating layer. In order to form a gate insulating layer having less leakage current at a low temperature, a rare gas element such as argon may be included in a reaction gas.

Next, a first conductive film and a second conductive film, which function as a gate electrode layer, are stacked over the gate insulating layer 1008. The first conductive film may be formed with a thickness of about greater than or equal to 20 nm and less than or equal to 100 nm, and the second conductive film may be formed with a thickness of about greater than or equal to 100 nm and less than or equal to 400 nm. In addition, the first conductive film and the second conductive film can be formed by a sputtering method, an evaporation method, a CVD method, or the like.

The first and the second conductive films may be formed of an element selected from tantalum (Ta), tungsten (W), titanium (Ti), molybdenum (Mo), aluminum (Al), copper (Cu), chromium (Cr), neodymium (Nd), or the like, an alloy material or a compound material containing the element as its main component, or the like. Further, as the first and second conductive films, a semiconductor film typified by a polycrystal silicon film doped with an impurity element such as phosphorus; an AgPdCu alloy, or the like may be used. This embodiment mode is described using a two-layer structure; however, the invention is not limited to this structure. Either a stacked layer structure of three or more layers or a single layer structure may be used.

Then, masks 1016a, 1016b, 1016c, 1016d, and 1016e are each formed of a resist material using a photolithography method. The first conductive film and the second conductive film are processed into a desired shape using the above-described masks, thereby forming a first gate electrode layer 1018a, a first gate electrode layer 1018b, a first gate electrode layer 1018c, a first gate electrode layer 1018d, a first conductive layer 1018e, a conductive layer 1020a, a conductive layer 1020b, a conductive layer 1020c, a conductive layer 1020d, and a conductive layer 1020e (see FIG. 6C).

Etching can be performed to form a desired tapered shape by an ICP (Inductively Coupled Plasma) etching method with appropriate control of the etching conditions (e.g., the amount of electric energy applied to a coiled electrode layer, the amount of electric energy applied to an electrode layer on the substrate side, the electrode temperature on the substrate side, and the like). An angle and the like of the tapered shape may also be controlled depending on the shape of the masks. Further, as an etching gas, the following can be appropriately used: a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$. In this embodiment mode, the second conductive film is etched using an etching gas containing $CF_4$, $Cl_2$, or $O_2$, and then, the first conductive film is successively etched using an etching gas containing $CF_4$ or $Cl_2$.

Next, the conductive layer 1020a, the conductive layer 1020b, the conductive layer 1020c, the conductive layer 1020d, and the conductive layer 1020e are processed to be a desired shape with the use of the mask 1016a, the mask 1016b, the mask 1016c, mask 1016d, and the mask 1016e. At this time, etching is performed under an etching condition of high selectivity of the second conductive film which forms the conductive layers with respect to the first conductive film which forms the first gate electrode layers and the first conductive layer. By this etching, a second gate electrode layer 1022a, a second gate electrode layer 1022b, a second gate electrode layer 1022c, a second gate electrode 1022d, and a second conductive layer 1022e are formed.

In this embodiment mode, the second gate electrode layers and the second conductive layer each also have a taper shape, and the taper angles thereof are larger than the taper angles of the first gate electrode layers 1018a, 1018b, 1018c, and 1018d and the first conductive layer 1018e. Here, "taper angle" refers to an angle formed by the meeting of a bottom surface with a side surface of an object. Thus, when the taper angle is 90°, the conductive layer has a perpendicular side surface to the bottom surface of the conductive layer. By setting the taper angle to smaller than 90°, coverage with a film to be stacked thereover is improved, so that defects can be reduced. Note that, in this embodiment mode, $Cl_2$, $SF_6$, and $O_2$ is used as an etching gas for forming the second gate electrode layers and the second conductive layer.

Through the above-described steps, a gate electrode layer 1024a and a gate electrode layer 1024b can be formed in a peripheral driver circuit region 1080, and a gate electrode layer 1024c, a gate electrode layer 1024d, and a conductive layer 1024e can be formed in a pixel region 1082 (see FIG. 6D). Note that the masks 1016a, 1016b, 1016c, 1016d, and 1016e are removed after the above-described step.

Next, by adding an impurity element which imparts n-type conductivity, a first n-type impurity region 1026a, a first n-type impurity region 1026b, a first n-type impurity region 1028a, a first n-type impurity region 1028b, a first n-type impurity region 1030a, a first n-type impurity region 1030b, and a first n-type impurity region 1030c are formed using the gate electrode layer 1024a, the gate electrode layer 1024b, the gate electrode layer 1024c, and the gate electrode layer 1024d as masks (see FIG. 7A).

In this embodiment mode, doping is performed by using phosphine ($PH_3$) as a doping gas including an impurity element. Here, phosphorus (P) which is an impurity element imparting n-type conductivity is added to the first n-type impurity regions at a concentration of about greater than or equal to $1\times10^{16}$ atoms/cm$^3$ and less than or equal to $5\times10^9$ atoms/cm$^3$.

Then, a mask 1032a which covers the single crystal semiconductor layer 1010, and masks 1032b and 1032c which cover part of the single crystal semiconductor layer 1014 are formed. Then, an impurity element which imparts n-type conductivity is added using the masks 1032a, 1032b, and 1032c, and the second gate electrode layer 1022b as masks. Thereby, a second n-type impurity region 1034a, a second n-type impurity region 1034b, a third n-type impurity region 1036a, a third n-type impurity region 1036b, a second n-type impurity region 1040a, a second n-type impurity region 1040b, a second n-type impurity region 1040c, a third n-type impurity region 1042a, a third n-type impurity region 1042b, a third n-type impurity region 1042c, and a third n-type impurity region 1042d are formed.

In this embodiment mode, doping is performed by using phosphine ($PH_3$) as a doping gas including an impurity element. Here, phosphorus (P) that is an impurity element imparting n-type conductivity is added to the second n-type impurity regions at a concentration of about greater than or equal to $1\times10^{17}$ atoms/cm$^3$ and less than or equal to $1\times10^{21}$ atoms/cm$^3$. The third n-type impurity regions 1036a and 1036b are formed to be doped with the impurity element imparting n-type conductivity at the same concentration as or at a slightly higher concentration than those of the third n-type impurity regions 1042a, 1042b, 1042c, and 1042d. Furthermore, a channel formation region 1038, a channel formation region 1044a, and a channel formation region 1044b are formed (see FIG. 7B).

The second n-type impurity regions are high-concentration impurity regions and function as source or drain regions. On the other hand, the third n-type impurity regions are low-concentration impurity regions and function as so-called lightly doped drain (LDD) regions. The third n-type impurity regions 1036a and 1036b are formed so as to be overlapped with the first gate electrode layer 1018b. Accordingly, an electric field around source or drain regions can be relieved and deterioration of on-current due to hot carriers can be suppressed. On the other hand, each of the third n-type impurity regions 1042a, 1042b, 1042c, and 1042d is not overlapped with the gate electrode layer 1024c or 1024d. Thus, an effect of reducing off-state current can be obtained.

Next, the masks 1032a, 1032b, and 1032c are removed, and masks 1046a and 1046b which cover the single crystal semiconductor layers 1012 and 1014 are formed. An impurity element which imparts p-type conductivity is added using the masks 1046a and 1046b and the gate electrode layer 1024a as masks. Accordingly, a first p-type impurity region 1048a, a first p-type impurity region 1048b, a second p-type impurity region 1050a, and a second p-type impurity region 1050b are formed.

In this embodiment mode, doping is performed using diborane ($B_2H_6$) as a doping gas including an impurity element. Here, boron (B) which is an impurity element imparting p-type conductivity is added to the first p-type impurity regions and the second p-type impurity regions at a concentration of about greater than or equal to $1\times10^{18}$ atoms/cm$^3$ and less than or equal to $5\times10^{21}$ atoms/cm$^3$. Further, a channel formation region 1052 is formed (see FIG. 7C).

The first p-type impurity regions are high-concentration impurity regions and function as source or drain regions. On the other hand, the second p-type impurity regions are low-concentration impurity regions, which are so-called lightly doped drain (LDD) regions.

Subsequently, the masks 1046a and 1046b are removed. After the masks are removed, an insulating film may be formed to cover the side surfaces of the gate electrode layers. The insulating film can be formed by a plasma CVD method or a low pressure CVD (LPCVD) method. Heat treatment, intense light irradiation, or laser light irradiation may be performed to activate the impurity elements.

Then, an interlayer insulating layer which covers the gate electrode layers and the gate insulating layer is formed. In this embodiment mode, a stacked layer structure of insulating films 1054 and 1056 is employed (see FIG. 8A). A silicon nitride oxide film is formed as the insulating film 1054 with a thickness of 100 nm and a silicon oxynitride film is formed as the insulating film 1056 with a thickness of 900 nm. In this embodiment mode, the interlayer insulating layer has a two-layer stacked layer structure; however, it may have either a single layer structure or a stacked layer structure including three or more layers. In this embodiment mode, the insulating film 1054 and the insulating film 1056 are formed successively by a plasma CVD method without being exposed to the atmosphere. Note that the material of the insulating films 1054 and 1056 are not limited to the above-described material.

The insulating film 1054 and the insulating film 1056 can be formed using a material selected from silicon oxide, silicon nitride, aluminum oxide, aluminum nitride, aluminum oxynitride, aluminum nitride oxide having a higher content of nitrogen than that of oxygen, diamond-like carbon (DLC), carbon film containing nitrogen, and other substances including inorganic insulating materials. Further, a siloxane resin may be used as well. A siloxane resin is a resin having a Si—O—Si bonding. Siloxane has a skeleton formed from a bonding of silicon (Si) and oxygen (O). As a substituent, an organic group (for example, an alkyl group or an aryl group) containing at least hydrogen is used. A fluoro group may be included in the organic group. Further, an organic insulating material such as polyimide, acrylic, polyamide, polyimide amide, benzocyclobutene, or polysilazane can be used.

Next, contact holes (openings) which reach the single crystal semiconductor layers and the gate electrode layers are formed in the insulating film 1054, the insulating film 1056, and the gate insulating layer 1008, using a mask formed of a resist material. Etching may be performed once or plural times according to selection ratio of a material to be used. In this embodiment mode, first etching is performed under the condition of high selectivity of the insulating film 1056 formed of a silicon oxynitride film with respect to the insulating film 1054 formed of a silicon nitride oxide film, and the gate insulating layer 1008, whereby the insulating film 1056 is removed. Next, the insulating film 1054 and the gate insulating layer 1008 are removed by second etching, and openings which reach source or drain regions are formed.

Then, a conductive film is formed to cover the openings, and the conductive film is etched. Therefore, a source electrode layer or a drain electrode layer 1058a, a source electrode layer or a drain electrode layer 1058b, a source electrode layer or a drain electrode layer 1060a, a source electrode layer or a drain electrode layer 1060b, a source electrode layer or a drain electrode layer 1062a, and a source electrode layer or a drain electrode layer 1062b, each of which is electrically connected to part of a source region or drain region, are formed. As the each source electrode layer or drain electrode layer, one or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), and tin (Sn); a compound or alloy material that contains one of the above-described elements as its main component (for example, indium tin oxide (ITO), indium zinc oxide (IZO), indium tin oxide that contains silicon oxide (ITSO), zinc oxide (ZnO), aluminum-neodymium (Al—Nd), magnesium-silver (Mg—Ag), or the like); a substance that is a combination of any of these compounds; or the like can be used. Alternatively, a silicide (for example, aluminum-silicon, molybdenum-silicon, or nickel silicide), a nitrogen-containing compound (for example, titanium nitride, tantalum nitride, or molybdenum nitride), silicon (Si) that is doped with an impurity element such as phosphorus (P), or the like can be used.

Through the above-described steps, a p-channel thin film transistor 1064 and an n-channel thin film transistor 1066 are formed in the peripheral driver circuit region 1080 and an n-channel thin film transistor 1068 and a capacitor wiring 1070 are formed in the pixel region 1082 (see FIG. 8B).

Next, an insulating film 1072 is formed as a second interlayer insulating layer. The insulating film 1072 can be formed of a material selected from silicon oxide, silicon nitride, silicon oxynitride, silicon nitride oxide, aluminum oxide, aluminum nitride (AlN), aluminum oxynitride (AlON), aluminum nitride oxide containing more nitrogen than oxygen, diamond-like carbon (DLC), a nitrogen-containing carbon film, phosphosilicate glass (PSG), borophosphosilicate glass (BPSG), an alumina film, polysilazane, or another substance containing an inorganic insulating material. Further, a siloxane resin may be used as well. An organic insulating material such as polyimide, acrylic, polyamide, polyimide amide or benzocyclobutene may also be used.

Then, a contact hole is formed in the insulating film 1072 in the pixel region 1082, and a pixel electrode layer 1074 is formed (see FIGC 8C). The pixel electrode layer 1074 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, or metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag), or an alloy or a metal nitride thereof.

A conductive composition containing a conductive high molecule (also referred to as a conductive polymer) also can be used as the pixel electrode layer 1074. A thin film of a conductive composition preferably has a sheet resistance of lower than or equal to 10000 Ω/square. When a thin film is formed as a pixel electrode layer having a light-transmitting property, light transmittance is preferably greater than or equal to 70 % at a wavelength of 550 nm. Note that resistance of a conductive high molecule which is included in the thin film is preferably lower than or equal to 0.1 Ω·cm.

As the conductive high molecular, a so-called X electron conjugated conductive high molecular can be used. For example, polyaniline and a derivative thereof, polypyrrole and a derivative thereof, polythiophene and a derivative thereof, and a copolymer of those materials can be given.

As for an organic resin, as long as a resin is compatible to a conductive high molecular or a resin can be mixed and dispersed into a conductive high molecular, a thermosetting resin, a thermoplastic resin, or a photocurable resin may be used. Specific examples of the organic resin are given below: a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as poly (vinylidene fluoride), polyvinyl fluoride, polytetrafluoroethylene, ethylene tetrafluoroethylene copolymer, or polychlorotrifluoroethylene; a vinyl resin such. as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin, or a copolymer of any of those resins.

Furthermore, by doping a conductive composition with acceptor type dopant or donor type dopant, a redox potential of a conjugated electron of a conjugated conductive high molecular compound is changed; therefore, electrical conductivity may be adjusted.

A halogen compound, a Lewis acid, a protonic acid, an organic cyano compound, an organic metal compound, or the like can be used as the acceptor type dopant. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, the above-described carboxylic acid compounds or sufonic acid compounds can be used. As the organic cyano compound, a compound in which two or more cyano groups are included in a conjugated bonding can be used. As the organic cyano compound, a compound having two or more cyano groups in a conjugated bonding, for example, tetracyanoethylene, tetracyanoethylene oxide, tetracyanobenzene, tetracyanoquinodimethane, and tetracyanoazanaphthalene are given.

As the donor type dopant, alkali metal, alkaline-earth metal, a quaternary amine compound, or the like can be given.

The above-described conductive composition is dissolved in water or an organic solvent (e.g., an alcohol-based solvent, a ketone-based solvent, an ester-based solvent, a hydrocarbon-based solvent, an aromatic-based solvent) and a thin film which serves as the pixel electrode layer 1074 can be formed by an application method, a coating method, a droplet discharge method (also referred to as an ink-jet method), a printing method, or the like.

Then, an insulating layer 1302 referred to as an alignment film is formed to cover the pixel electrode layer 1074 and the insulating film 1072 (see FIG. 9B). The insulating layer 1302 can be formed by a screen printing method or an offset printing method. FIGS. 9A and 9B are a plane view and a cross sectional view of a semiconductor device. FIG. 9A is a plane view of the semiconductor device, and FIG. 9B is a cross sectional view taken along a line C-D of FIG. 9A. The semiconductor device includes an external terminal connection region 1076, a sealing region 1078, a peripheral driver circuit region 1080, and a pixel region 1082.

After forming the insulating layer 1302, rubbing treatment is performed. An insulating layer 1306 which functions as an alignment film can be formed in a similar manner to the insulating layer 1302.

After that, a counter substrate 1300 and the base substrate 1000 having an insulating surface are bonded to each other with a sealant 1314 and a spacer 1316 interposed therebetween, and the space is provided with a liquid crystal layer 1304. The counter substrate 1300 is provided with the insulating layer 1306 functioning as an alignment film, a conductive layer 1308 functioning as a counter electrode, a colored layer 1310 functioning as a color filter, a polarizer 1312 (also referred to as a polarizing plate), and the like. Note that the base substrate 1000 having the insulating surface is provided with a polarizer 1318 (polarizing plate); however, the present invention is not limited thereto. For example, in a reflective liquid crystal display device, a polarizer may be provided for either a counter substrate or a base substrate.

Then, an FPC 1324 is connected to a terminal electrode layer 1320 which is electrically connected to the pixel region, through an anisotropic conductive layer 1322. The FPC 1324 has a function of transmitting a signal from the external. The liquid crystal display device can be manufactured by the above-described steps.

Note that a method for manufacturing a liquid crystal display device is described in this embodiment mode; however, the present invention is not limited thereto. Furthermore, a transistor included in a peripheral circuit, a pixel, and the like in a light-emitting device provided with a light-emitting element can be formed using the SOI substrate shown in the above-described embodiment mode.

This embodiment mode can be implemented in combination with the above-described embodiment modes as appropriate.

(Embodiment Mode 5)

In this embodiment mode, an electronic devices which are manufactured using an SOI substrate shown in the above-described embodiment mode will be described with reference to FIGS. 11A to 11H.

As an electronic device which is manufactured using the SOI substrate in the above-described embodiment mode, the following can be given: a camera such as a video camera or a digital camera, a goggle type display (a head mounted display), a navigation system, an audio reproducing device (car audio set, audio component set, or the like), a computer, a game machine, a portable information terminal (mobile computer, mobile phone, portable game machine, e-book reader, or the like), and an image reproducing device provided with a recording medium (specifically, a device provided with a display device that can reproduce a recording medium such as a digital versatile disc (DVD) and display the image), and the like.

Figure 11A:
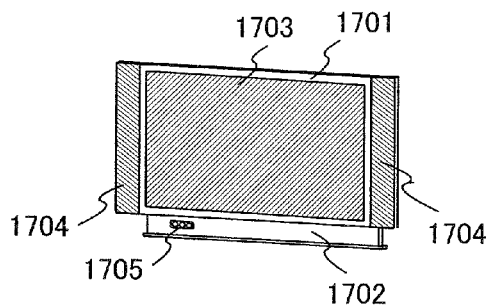
FIGS. 11A to 11H are diagrams each illustrating an electronic device using an SOI substrate of the present invention.

FIG. 11A shows a television set or a monitor of a personal computer, which includes a housing 1701, a support stand 1702, a display portion 1703, speakers 1704, video input terminal 1705, and the like. In the display portion 1703, the SOI substrate shown in the above-described embodiment mode is used. A television set or a monitor of a personal computer with high reliability and high performance can be provided with the use of the SOI substrate shown in the above-described embodiment mode.

Figure 11B:
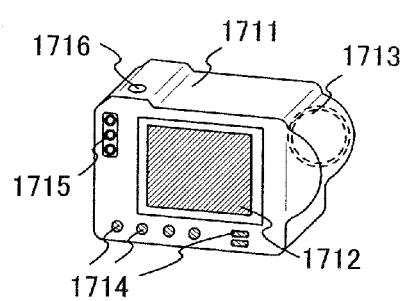

FIG. 11B shows a digital camera. An image receiving portion 1713 is provided in the front side of a main body 1711. A shutter button 1716 is provided at the upper portion of the main body 1711. A display portion 1712, operation keys 1714, and an external connection port 1715 are provided at the backside of the main body 1711. A semiconductor device using the SOI substrate of the present invention is used in the display portion 1712. According to the present invention, a digital camera with high reliability and high performance can be provided.

Figure 11C:
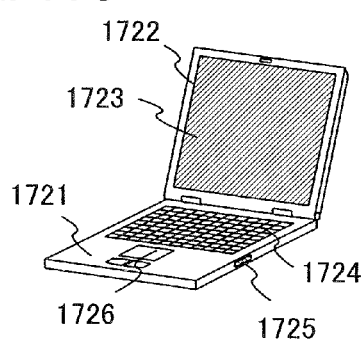

FIG. 11C shows a laptop computer. A main body 1721 is provided with a keyboard 1724, an external connection port 1725, and a pointing device 1726. Further, the main body 1721 is provided with a housing 1722 including a display portion 1723. In the display portion 1723, the SOI substrate shown in the above-described embodiment mode is used. A laptop computer with high reliability and high performance can be provided with the use of the SOI substrate shown in the above-described embodiment mode.

Figure 11D:
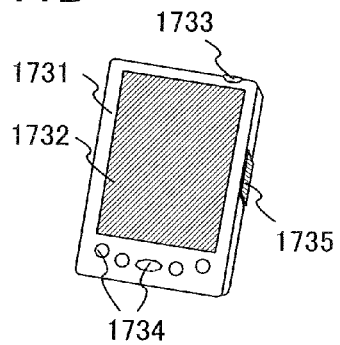

FIG. 11D shows a mobile computer, which includes a main body 1731, a display portion 1732, a switch 1733, operation keys 1734, an infrared port 1735, and the like. The display portion 1732 is provided with an active matrix display device. In The display portion 1732, the SOI substrate shown in the above-described embodiment mode is used. A mobile computer with high reliability and high performance can be provided with the use of the SOI substrate shown in the above-described embodiment mode.

Figure 11E:
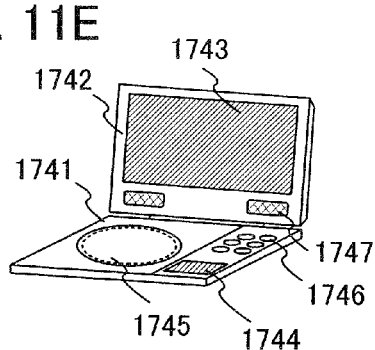

FIG. 11E shows an image reproducing device. A main body 1741 is provided with a display portion B 1744, a storage media reading portion 1745, and operation keys 1746. Furthermore, the main body 1741 is provided with a housing 1742 which includes a speaker portion 1747 and a display portion A 1743. The display portion A 1743 and the display portion B 1744 are each provided with the SOI substrate shown in the above-described embodiment mode. An image reproducing device with high reliability and high performance is provided with the use of the SOI substrate shown in the above-described embodiment mode.

Figure 11F:
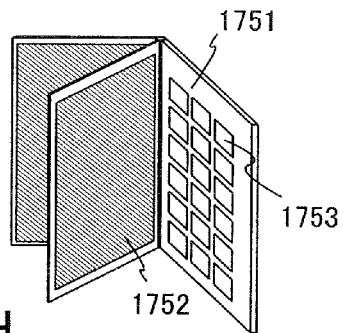

FIG. 11F shows an electronic book reader. A main body 1751 is provided with operation keys 1753. Further, plural displays 1752 are attached to the main body 1751. In the plural displays 1752, the SOI substrates shown in the above-described embodiment mode is used. An electronic book reader with high reliability and high performance can be provided with the use of the SOI substrate shown in the above-described embodiment mode.

Figure 11G:
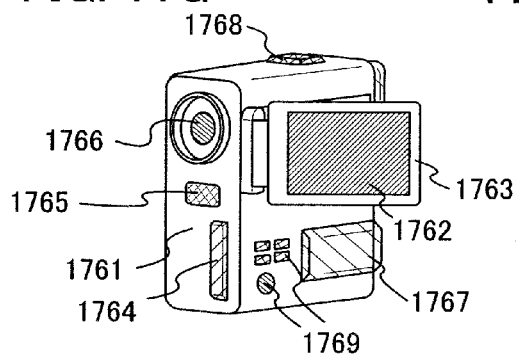

FIG. 11G shows a video camera. A main body 1761 is provided with an external connection port 1764, a remote control receiving portion 1765, an image receiving portion 1766, a battery 1767, an audio input portion 1768, and operation keys 1769. The main body 1761 is provided with a housing 1763 which includes a display portion 1762. In the display portion 1762, the SOI substrate shown in the above-described embodiment mode is used. A video camera with high reliability and high performance can be provided with the use of the SOI substrate shown in the above-described embodiment mode.

Figure 11H:
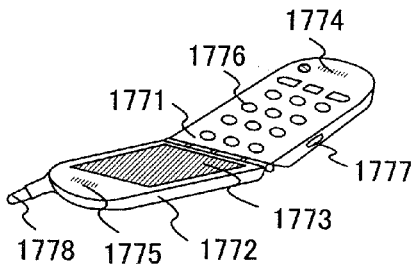

FIG. 11H shows a mobile phone, which includes a main body 1771, a housing 1772, a display portion 1773, an audio input portion 1774, an audio output portion 1775, operation keys 1776, an external connecting port 1777, an antenna 1778, and the like. In the display portion 1773, the SOI substrate shown in the above-described embodiment mode is used. A mobile phone with high reliability and high performance can be provided with the use of the SOI substrate shown in the above-described embodiment mode.

As described above, the present invention can be widely applied and can be used for electronic devices of every field.

This application is based on Japanese Patent Application serial no. 2007-239524 filed with Japan Patent Office on Sep. 14, 2007, the entire contents of which are hereby incorporated by reference.

What is claimed is:

1. A method for manufacturing an SOI substrate comprising the steps of:
   forming an oxide film on a surface of each of a plurality of semiconductor substrates by performing heat treatment on each of the plurality of semiconductor substrates in an oxidative atmosphere containing a halogen;
   arranging the plurality of semiconductor substrates on a first base substrate;
   irradiating the plurality of semiconductor substrates on the first base substrate with an ion beam in a rectangular shape or a linear shape through the oxide film while moving the plurality of semiconductor substrates relative to the ion beam in a short side direction of the ion beam, thereby forming a separation layer in a region at a predetermined depth from the surface of each of the plurality of semiconductor substrates;
   forming a nitrogen-containing layer over the oxide film;
   forming an insulating layer over the nitrogen-containing layer;
   bonding the insulating layer and a second base substrate; and
   forming a single crystal semiconductor layer over the second base substrate with the insulating layer, the nitrogen-containing layer, and the oxide film interposed therebetween by cleaving each of the plurality of semiconductor substrates with the separation layer functioning as a cleavage plane,
   wherein the ion beam is irradiated to the plurality of semiconductor substrates from a direction substantially perpendicular to the plurality of semiconductor substrates at the same time.

2. A method for manufacturing an SOI substrate according to claim 1, wherein the insulating layer is silicon oxide.

3. A method for manufacturing an SOI substrate according to claim 1, wherein $H_3^+$ ions are a main component of the ion beam.

4. A method for manufacturing an SOI substrate according to claim 1, wherein the surface of each of the plurality of semiconductor substrates is a $\{110\}$ plane.

5. A method for manufacturing an SOI substrate according to claim 1, wherein the second base substrate is a glass substrate.

6. A method for manufacturing an SOI substrate according to claim 1, wherein the insulating layer is formed over each of the plurality of semiconductor substrates after the irradiating step.

7. A method for manufacturing an SOI substrate according to claim 1, further comprising the step of activating the insulating layer by plasma irradiation or radical treatment.

8. A method for manufacturing a semiconductor device comprising the steps of:
   forming an oxide film on a surface of each of a plurality of semiconductor substrates by performing heat treatment on each of the plurality of semiconductor substrates in an oxidative atmosphere containing a halogen;
   arranging the plurality of semiconductor substrates on a first base substrate;
   irradiating the plurality of semiconductor substrates on the first base substrate with an ion beam in a rectangular shape or a linear shape through the oxide film while moving the plurality of semiconductor substrates relative to the ion beam in a short side direction of the ion beam, thereby forming a separation layer in a region at a predetermined depth from the surface of each of the plurality of semiconductor substrates;
   forming a nitrogen-containing layer over the oxide film;
   forming an insulating layer over the nitrogen-containing layer;
   bonding the insulating layer and a second base substrate; and
   forming a single crystal semiconductor layer over the second base substrate with the insulating layer, the nitrogen-containing layer, and the oxide film interposed therebetween by cleaving each of the plurality of semiconductor substrates with the separation layer functioning as a cleavage plane;
   forming a gate electrode over the single crystal semiconductor layer with a gate insulating layer interposed therebetween;
   forming source or drain regions in the single crystal semiconductor layer; and
   forming a pixel electrode over the gate electrode,
   wherein the ion beam is irradiated to the plurality of semiconductor substrates from a direction substantially perpendicular to the plurality of semiconductor substrates at the same time.

9. A method for manufacturing a semiconductor device according to claim 8, wherein the insulating layer is silicon oxide.

10. A method for manufacturing a semiconductor device according to claim 8, wherein $H_3^+$ ions are a main component of the ion beam.

11. A method for manufacturing a semiconductor device according to claim 8, wherein the surface of each of the plurality of semiconductor substrates is a {110} plane.

12. A method for manufacturing a semiconductor device according to claim 8, wherein the second base substrate is a glass substrate.

13. A method for manufacturing a semiconductor device according to claim 8, wherein the semiconductor device is a liquid crystal display device.

14. A method for manufacturing a semiconductor device according to claim 8, wherein the insulating layer is formed over each of the plurality of semiconductor substrates after the irradiating step.

15. A method for manufacturing a semiconductor device according to claim 8, further comprising the step of activating the insulating layer by plasma irradiation or radical treatment.

16. A method for manufacturing an SOI substrate comprising the steps of:
arranging a plurality of semiconductor substrates on a first base substrate;
irradiating the plurality of semiconductor substrates on the first base substrate with an ion beam in a rectangular shape or a linear shape while moving the plurality of semiconductor substrates relative to the ion beam in a short side direction of the ion beam, thereby forming a separation layer in a region at a predetermined depth from a surface of each of the plurality of semiconductor substrates;
bonding each of the plurality of semiconductor substrates and a second base substrate through an insulating layer;
forming a single crystal semiconductor layer over the second base substrate by cleaving each of the plurality of semiconductor substrates with the separation layer functioning as a cleavage plane,
wherein the ion beam is irradiated to the plurality of semiconductor substrates from a direction substantially perpendicular to the plurality of semiconductor substrates at the same time.

17. A method for manufacturing an SOI substrate according to claim 16, wherein the insulating layer is silicon oxide.

18. A method for manufacturing an SOI substrate according to claim 16, wherein $H_3^+$ ions are a main component of the ion beam.

19. A method for manufacturing an SOI substrate according to claim 16, wherein the surface of each of the plurality of semiconductor substrates is a {110} plane.

20. A method for manufacturing an SOI substrate according to claim 16, wherein the second base substrate is a glass substrate.

21. A method for manufacturing an SOI substrate according to claim 16, wherein the insulating layer is formed over each of the plurality of semiconductor substrates after the irradiating step.

22. A method for manufacturing an SOI substrate according to claim 16, further comprising the step of activating the insulating layer by plasma irradiation or radical treatment.

23. A method for manufacturing a semiconductor device comprising the steps of:
arranging a plurality of semiconductor substrates on a first base substrate;
irradiating the plurality of semiconductor substrates on the first base substrate with an ion beam in a rectangular shape or a linear shape while moving the plurality of semiconductor substrates relative to the ion beam in a short side direction of the ion beam, thereby forming a separation layer in a region at a predetermined depth from a surface of each of the plurality of semiconductor substrates;
bonding each of the plurality of semiconductor substrates and a second base substrate through an insulating layer;
forming a single crystal semiconductor layer over the second base substrate by cleaving each of the plurality of semiconductor substrates with the separation layer functioning as a cleavage plane;
forming a gate electrode over the single crystal semiconductor layer with a gate insulating layer interposed therebetween;
forming source or drain regions in the single crystal semiconductor layer; and
forming a pixel electrode over the gate electrode,
wherein the ion beam is irradiated to the plurality of semiconductor substrates from a direction substantially perpendicular to the plurality of semiconductor substrates at the same time.

24. A method for manufacturing a semiconductor device according to claim 23, wherein the insulating layer is silicon oxide.

25. A method for manufacturing a semiconductor device according to claim 23, wherein $H_3^+$ ions are a main component of the ion beam.

26. A method for manufacturing a semiconductor device according to claim 23, wherein the surface of each of the plurality of semiconductor substrates is a {110} plane.

27. A method for manufacturing a semiconductor device according to claim 23, wherein the second base substrate is a glass substrate.

28. A method for manufacturing a semiconductor device according to claim 23, wherein the semiconductor device is a liquid crystal display device.

29. A method for manufacturing a semiconductor device according to claim 23, wherein the insulating layer is formed over each of the plurality of semiconductor substrates after the irradiating step.

30. A method for manufacturing a semiconductor device according to claim 23, further comprising the step of activating the insulating layer by plasma irradiation or radical treatment.

* * * * *